(12) United States Patent
Mizutani et al.

(10) Patent No.: US 7,232,640 B1
(45) Date of Patent: Jun. 19, 2007

(54) POSITIVE RESIST COMPOSITION

(75) Inventors: Kazuyoshi Mizutani, Shizuoka (JP); Shoichiro Yasunami, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/812,092

(22) Filed: Mar. 30, 2004

(30) Foreign Application Priority Data

Mar. 31, 2003 (JP) .......................... P. 2003-096390

(51) Int. Cl.
  G03F 7/039 (2006.01)
  G03F 7/26 (2006.01)

(52) U.S. Cl. .................................... 430/270.1; 430/326

(58) Field of Classification Search .............. 430/270.1
  See application file for complete search history.

(56) References Cited

U.S. PATENT DOCUMENTS

| | | | |
|---|---|---|---|
| 5,558,976 A * | 9/1996 | Urano et al. .............. | 430/270.1 |
| 5,643,669 A * | 7/1997 | Tsuei ........................ | 428/354 |
| 5,837,420 A * | 11/1998 | Aoai et al. ................ | 430/270.1 |
| 6,051,370 A * | 4/2000 | Kim .......................... | 430/270.1 |
| 2001/0008739 A1* | 7/2001 | Nishyama et al. ....... | 430/270.1 |
| 2003/0065101 A1* | 4/2003 | Blakeney et al. .......... | 525/288 |
| 2003/0114589 A1* | 6/2003 | Suetsugu et al. .......... | 525/132 |
| 2003/0224287 A1* | 12/2003 | Fujimori .................. | 430/270.1 |

FOREIGN PATENT DOCUMENTS

| | | |
|---|---|---|
| JP | 2-19847 A | 1/1990 |
| JP | 4-219757 A | 8/1992 |
| JP | 2002-49156 A | 2/2002 |
| JP | 2002-323768 A | 11/2002 |

OTHER PUBLICATIONS

Toru et al, Publication No. 2002-049156, English abstract of JP2002-049156 published Feb. 15, 2002 with attached machine translated Claims and Example of Document from Patent Abstracts of Japan, copyright 2003, Japan Patent Office, 9 pages.*

Tsiartas et al , "The Mechanism of Phenolic Polymer Dissolution: A New Perspective", Macromolecules, 1977, vol. 30, pp. 4656-4664.*

Thomson translation of JP 2002-49156 published Feb. 15, 2002, 96 pages.*

Flanigan et al, "Surface roughness development during photoresist dissolution," J. Vac. Sci. Technol. B 17 (4), Jul./Aug. 1999, American Vacuum Society, pp. 1371-1379.*

* cited by examiner

Primary Examiner—Cynthia Hamilton
(74) Attorney, Agent, or Firm—Sughrue Mion, PLLC

(57) ABSTRACT

A positive resist composition comprising a polymer capable of increasing its solubility in an alkali developer under action of an acid, wherein the resin comprises repeating units containing at least two special types of acetal structures separately, a compound capable of generating an acid upon irradiation with an actinic ray or radiation, and a solvent.

13 Claims, No Drawings

POSITIVE RESIST COMPOSITION

FIELD OF THE INVENTION

The present invention relates to a positive resist composition suitable for use in nanolithography processes for manufacturing VLSI and high-capacity microchips, or other photo-fabrication processes. More specifically, the invention is concerned with a positive resist composition capable of forming finer-resolution patterns by using electron beams, X-rays or EUV rays. In particular, the invention relates to a positive resist composition highly suitable for use in super minute patterning for semiconductor devices by utilizing high-energy beams, such as electron beams.

BACKGROUND OF THE INVENTION

In manufacturing processes of semiconductor devices, such as ICs and LSI circuits, fine patterning by photolithography using resist compositions has hitherto been carried out. In recent years, demand for superfine patterning in a submicron region or a quarter-micron region has grown as integrated circuits have increased in packing density. In order to meet such a demand, exposure light sources used in photolithography have been changed to those of shorter wavelengths, specifically from g-ray to i-ray, further to KrF excimer laser light. In addition to photolithography using excimer laser light, developments of lithography processes using either electron beams, or X-rays, or EUV light are proceeding now, too.

As resists suitable for the lithography processes using electron beams, X-rays and EUV light, respectively, chemical amplification resists utilizing acid-catalyzed reaction are mainly used from the viewpoint of increases in sensitivity. With respect to positive resists, chemically amplified resist compositions whose main components are polymers having properties of being insoluble or slightly soluble in alkaline aqueous solutions and becoming soluble therein under the action of acids (hereinafter referred to as acid-decomposable resins, too) and acid generators are used effectively.

Transfer of resist techniques for KrF excimer laser to positive resists for electron-beam lithography or X-ray lithography have been mainly tried so far, and feasibility thereof has been contemplated. For instance, Patent Document 1 (JP-A-2-19847) discloses the resist composition containing poly(p-hydroxystyrene) whose phenolic hydroxyl groups are totally or partially protected by tetrahydropyranyl groups.

Patent Document 2 (JP-A-4-219757) discloses the resist composition containing a polymer obtained by replacing 20 to 70% of the phenolic hydroxyl groups in poly(p-hydroxystyrene) with acetal groups.

Patent Document 3 (JP-A-2002-49156) discloses the positive photoresist composition containing a polymer obtained by replacing phenolic hydroxyl groups of poly(p-hydroxystyrene) with acetal groups of two different kinds and thereby giving excellent performances in terms of resolution, development defect, linearity and dry-etching resistance.

Patent Document 4 (JP-A-2002-323768) discloses the resist composition ensuring improved line-width stability in patterns formed under a condition that the resist coating is left standing in vacuo after exposure.

However, the present state is that high resolution, slight line edge roughness and in-vacuo PED (Post Exposure Delay) characteristic requirements cannot be satisfied concurrently even by the foregoing art.

The term "line edge roughness" refers to a condition that, owing to characteristics of a resist composition used, the edges of the interface between each resist line pattern and a substrate have such a shape as to fluctuate in a direction perpendicular to the line direction. When this line pattern is observed from the position right above, the edges look rough (to an extent of ± dozens nm). This roughness is transferred to the substrate through an etching process, and too rough edges cause impairment of electric characteristics and reduce yield. Thus, the desire to improve line edge roughness is growing as the pattern size is reduced to a quarter micron or below.

Further, the line-width stability of patterns formed under a condition that the resist coating is left standing in vacuo after exposure (in-vacuo PED) is a very important property because exposure is carried out in vacuo when electron beams or X-rays are used as exposure source. Inferiority of in-vacuo PED characteristic causes great variations in resist properties between the beginning and the end of drawing with electron beams or X-rays; as a result, line widths of the drawn patterns seriously lack in-plane uniformity and a considerable reduction in yield occurs.

In addition, there is a problem that the line edge roughness also becomes worse by leaving the resist coating standing in vacuo.

On the other hand, the use of EUV as light source causes a problem that the contrast is lowered by concerted photochemical reaction, such as positive-to-negative conversion, ascribable to EUV light, because the wavelengths of the light source are included in the extreme ultraviolet region and the EUV light has high energy.

It is difficult for the combinations of hitherto known arts to ensure both very acceptable line edge roughness and favorable in-vacuo PED characteristic (variations in line width and line edge roughness) under irradiation with electron beams or X-rays, so it has been desired to attain compatibility between those two performances. Additionally, it has also been desired to achieve both sufficiently high sensitivity and contrast even under EUV irradiation.

[Patent Document 1] JP-A-2-19847

[Patent Document 2] JP-A-4-219757

[Patent Document 3] JP-A-2002-49156

[Patent Document 4] JP-A-2002-323768

SUMMARY OF THE INVENTION

An object of the invention is to solve problems of performance-enhancement techniques in fine patterning for semiconductor devices by use of high-energy beams, especially electron beams, X-rays or EUV light. More specifically, an object of the invention is to provide a positive resist composition capable of satisfying both requirements for in-vacuo PED characteristic and line edge roughness when electron beams are used as an irradiation source and having excellent sensitivity and dissolution contrast when EUV light is used as an irradiation source.

The following positive resist compositions responsive to electron beams, X-rays or EUV are embodiments of the invention.

(1) A positive resist composition for electron-beam, X-ray or EUV, comprising:

(a) a polymer capable of increasing its solubility in an alkali developer under action of an acid, wherein the polymer has repeating units represented by formula (I), repeating units represented by formula (II) and repeating units represented by formula (III), (b) a compound capable of generating an acid upon irradiation with an actinic ray or radiation, and (c) a solvent:

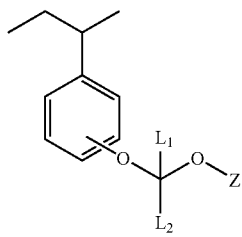

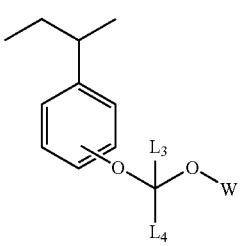

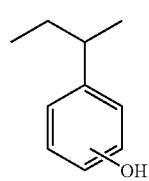

wherein $L_1$ to $L_4$, which are the same or different, each represents a hydrogen atom, a straight-chain, branched or cyclic alkyl group or an aralkyl group, and Z represents a straight-chain, branched or cyclic alkyl group or an aralkyl group, W has the same meaning as Z, and Z and $L_1$, or W and $L_4$, may be combined each other to form 5- or 6-membered ring, provided that the groups represented by Z and W are not the same.

(2) The composition according to the above (1), wherein the group represented by W is a group having an alicyclic or aromatic group.

(3) The composition according to the above (1), wherein the polymer (a) has a molecular weight dispersion degree of 1.5 or below.

(4) The composition according to the above (1), wherein the content of the repeating unit represented by formula (I) is from 5 to 60 mole % based on the total repeating units in the resin.

(5) The composition according to the above (1), wherein the content of the repeating unit represented by formula (I) is from 5 to 30 mole % based on the total repeating units in the resin.

(6) The composition according to the above (1), wherein the content of the repeating unit represented by formula (II) is from 5 to 60 mole % based on the total repeating units in the resin.

(7) The composition according to the above (1), wherein the content of the repeating unit represented by formula (II) is from 5 to 30 mole % based on the total repeating units in the resin.

(8) The composition according to the above (1), wherein the content ratio of repeating units of formula (I) to repeating units of formula (II) in the resin is from 0.10:1 to 1:0.10.

(9) The composition according to the above (1), wherein the content ratio of repeating units of formula (I) to repeating units of formula (II) in the resin is from 0.25:1 to 1:0.25.

(10) The composition according to the above (1) wherein the polymer (a) further comprises a repeating unit corresponding to tertiary alkyl(meth)acrylate.

(11) The composition according to the above (1) wherein the content of the component (b) is from 2 to 10% by weight based on the total solids in the composition.

(12) The composition according to the above (1), further comprising a fluorine-based and/or silicon-based surfactant.

(13) The composition according to claim 1, further comprising a basic compound.

(14) A pattern formation method comprising steps of forming a resist film by using the positive resist composition claimed in the above (1), and exposing and developing said resist film.

DETAILED DESCRIPTION OF THE INVENTION

The invention is described below in detail.

An electron-beam, X-ray or EUV positive resist composition relating to the invention comprises at least a polymer (a) having repeating units represented by formula (I), repeating units represented by formula (II) and repeating units represented by formula (III) and capable of decomposing under action of an acid to increase solubility in an alkali developer, a compound (b) capable of generating an acid upon irradiation with an actinic ray or radiation, and a solvent (c).

In the present invention, the phrase "an actinic ray or radiation" comprises an electron-beam, X-ray and EUV.

Each of the components mixed in the present positive resist composition responsive to electron beams, X-rays or EUV is illustrated below.

(a) A Polymer Capable of Increasing Its Solubility in an Alkali Developer Under Action of an Acid, and Having Repeating Units Represented by Formulae (I), (II) and (III)

(hereinafter referred to as "acid-decomposable polymer (a)", too)

An acid-decomposable polymer (a) used in the invention has repeating units represented by formulae (I), (II) and (III).

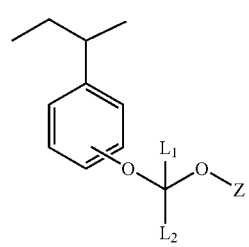

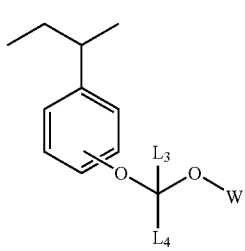

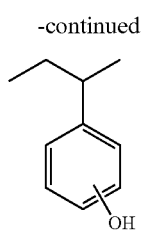
(III)

In the above formulae, $L_1$ to $L_4$, which are the same or different, each represents a hydrogen atom, a straight-chain, branched or cyclic alkyl group or an aralkyl group, and Z represents a straight-chain, branched or cyclic alkyl group or an aralkyl group.

W has the same meaning as Z, and Z and $L_1$, or W and $L_4$, may be combined each other to form 5- or 6-membered ring, provided that the groups represented by Z and W are not the same.

Examples of an alkyl group represented by each of $L_1$ to $L_4$, Z and W in the foregoing formulae include straight-chain, branched or cyclic alkyl groups containing 1 to 20 carbon atoms, such as a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group and a dodecyl group. These groups each may have a substituent.

Suitable examples of a substituent the alkyl group represented by $L_1$ to $L_4$, Z and W each may have include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thophenemethyl carbonyloxy group, and hetero ring residues, such as a pyrrolidone residue. And it is preferable that the number of carbon atoms contained in those substituents each is 12 or below.

Examples of an alkyl group having a substituent include a cyclohexylethyl group, an alkylcarbonyloxymethyl group, an alkylcarbonyloxyethyl group, an arylcarbonyloxyethyl group, an aralkylcarbonyloxyethyl group, an alkyloxymethyl group, an aryloxymethyl group, an aralkyloxymethyl group, an alkyloxyethyl group, an aryloxyethyl group, an aralkyloxyethyl group, an alkylthiomethyl group, an arylthiomethyl group, an aralkylthiomethyl group, an alkylthioethyl group, an arylthioethyl group and an aralkylthioethyl group.

The alkyl moieties in the groups recited above have no particular restriction, but may be any of straight-chain, cyclic and branched ones and further may have any of the substituents recited above, such as alkyl and alkoxy groups.

Examples of the alkylcarbonyloxyethyl group mentioned above include a cyclohexylcarbonyloxyethyl group, a t-butylcyclohexylcarbonyloxyethyl group, and an n-butylcyclohexylcarbonyloxyethyl group.

The aryl moieties in the groups recited above have no particular restriction, too. They may generally include aryl groups having 6 to 14 carbon atoms, such as a phenyl group, a xylyl group, a tolyl group, a cumenyl group and an anthranyl group, and further may have any of the substituents recited above, such as alkyl and alkoxy groups. Examples of the aryloxyethyl group mentioned above include a phenyloxyethyl group and a cyclohexylphenyloxyethyl group, which may further have substituents.

The aralkyl groups in the groups recited above have no particular restriction, too. An example of such moieties is a benzyl group.

An example of the aralkylcarbonyloxyethyl group mentioned above is a benzylcarbonyloxyethyl group, which may further have a substituent.

Examples of an aralkyl group represented by each of $L_1$ to $L_4$, Z and W in formulae (I) and (II) include aralkyl groups having 7 to 15 carbon atoms, such as a benzyl group and a phenetyl group. These groups each may further have a substituent.

Suitable examples of a substituent the aralkyl group may have include an alkoxy group, a hydroxyl group, a halogen atom, a nitro group, an acyl group, an acylamino group, a sulfonylamino group, an alkylthio group, an arylthio group and an aralkylthio group. Examples of an aralkyl group having a substituent include an alkoxybenzyl group, a hydroxybenzyl group and a phenylthiophenetyl group. The number of carbon atoms contained in a substituent the aralkyl group of $L_1$ to $L_4$, Z or W can have is preferably 12 or below.

Examples of a 5- or 6-membered ring formed by combining Z and $L_1$ or by combining W and $L_4$ include a tetrahydropyran ring and a tetrahydrofuran ring.

In the acid-decomposable polymer (a) used in the invention, the groups Z and W represent are required to be different from each other.

In the invention, it is preferable that the group represented by W is a group having an alicyclic radical or an aromatic group. In such a case, the group represented by Z is preferably a straight-chain or branched alkyl group. When W and Z represent those groups, the invention can achieve more marked effects.

Suitable examples of the foregoing alicyclic group include those containing 5 to 12 carbon atoms, such as a cyclopentyl group, a cyclohexyl group, a cycloheptyl group, a cyclooctyl group, a cyclononyl group and a cyclodecanyl group. Suitable examples of the foregoing aromatic group include those containing 6 to 16 carbon atoms, such as a phenyl group and a naphthyl group. These aromatic groups each may further have a substituent, with examples including a methylphenyl group and an ethylphenyl group. Each of those alicyclic groups or aromatic radicals may be all that constitute the group of W, or may be combined with an alkylene group or another linkage group to form the group of W.

Suitable examples of an alicyclic- or aromatic-containing group represented by W include a phenoxyethyl group, a cyclohexylphenoxyethyl group, a cyclohexylthioethyl group, a t-butylcyclohexylcarbonyloxyethyl group, an n-butylcyclohexylcarbonyloxyethyl group, a cyclohexanone-4-yl-phenoxyethyl group, a cyclohexyl group, a cyclohexylethyl group, a phenetyl group and a benzyl group.

Suitable examples of a straight-chain or branched alkyl group represented by Z include an ethyl group, a propyl group, an isopropyl group, an n-butyl group, an i-butyl group and a t-butyl group.

It is also admitted that edge roughness can be improved by introducing a bulky group, such as a phenyl or cyclohexyl group, to the terminal of a substituted alkyl group or a substituted aralkyl group as mentioned above.

In the acid-decomposable polymer (a), it is preferable that the repeating units represented by formula (I) contain 5 to 60 mole % (preferably 5 to 30 mole %) based on the total repeating units, the repeating units represented by formula (II) contain 5 to 60 mole % (preferably 5 to 30 mole %) based on the total repeating units and the repeating units represented by formula (III) contains 20 to 80 mole % (preferably 40 to 80 mole %) based on the total repeating units. Further, other repeating units may be contained in the acid-decomposable polymer (a) as required.

The suitable ratio of the content of repeating units of formula (I) to the content of repeating units of formula (II) in the acid-decomposable polymer (a) ((I): (II)) is from 0.10:1 to 1:0.10, preferably from 0.25:1 to 1:0.25.

The present acid-decomposable polymer (a) can be prepared, e.g., as follows: A polymer having phenolic hydroxyl groups, which is preferably dissolved in an organic solvent, is dehydrated by using a process of azeotropic distillation, and then admixed with two or more kinds of alkyl vinyl ether compounds and an acid catalyst to undergo acetalation reaction: Thus, the desired acetal groups are introduced into phenolic hydroxyl groups and the intended polymer is obtained.

As the polymer having phenolic hydroxyl groups, polymers of hydroxystyrenes are suitable, and copolymers of hydroxystyrenes and acid-decomposable (meth)acrylates (e.g. t-butyl acrylate or t-butyl methacrylate) are also usable.

For the purpose of adjusting alkali solubility of an acid-decomposable polymer (a) relating to the invention, acid-indecomposable groups can further be introduced into a polymer having phenolic hydroxyl groups. Suitable examples of a method of introducing acid-indecomposable groups include a method of copolymerizing hydroxystyrenes and styrenes, acid-indecomposable (meth)acrylates or acid-indecomposable (meth)acrylamides, and a method of protecting hydroxyl groups of hydroxystyrenes with acid-indecomposable substituent groups.

Suitable examples of the foregoing acid-indecomposable substituent group include an acetyl group, a mesyl group and a toluenesulfonyl group, but not limited to these groups.

Examples of the foregoing styrenes include styrene, chlorostyrene, dichlorostyrene, bromostyrene, dibromostyrene, iodostyrene, methylstyrene, dimethylstyrene, ethylstyrene, isopropylstyrene, methoxystyrene, ethoxystyrene, phenylstyrene, t-butylstyrene and t-butoxystyrene. Of these styrenes, styrene, methylstyrene, t-butylstyrene and t-butoxystyrene are preferred in particular.

Examples of the foregoing acid-indecomposable (meth) acrylates include methyl(meth)acrylate, ethyl (meth)acrylate, propyl(meth)acrylate, allyl (meth)acrylate, glycidyl (meth)acrylate, benzyl (meth)acrylate and hydroxyethyl (meth)acrylate.

Examples of acid-indecomposable (meth) acrylamides include (meth)acrylic amide, (meth)acrylic phenylamide and (meth)acrylic isopropylamide.

Examples of monomers which can further be copolymerized include maleic acid derivatives, maleic anhydride derivatives, (meth)acrylonitrile, vinylpyrrolidone, vinylpyridine and vinyl acetate.

As mentioned above, it is possible to introduce copolymerizing components and/or acid-indecomposable groups into the polymer having phenolic hydroxyl groups within the bounds of alkali solubility adjustment for the acid-decomposable polymer (a) and no impairment of alkali developability.

From the viewpoints of dry etching resistance and sensitivity, it is generally preferable that the hydroxystyrene component constitutes at least 60 mole %, favorably at least 70 mole %, based the components making up the polymer having phenolic hydroxyl groups.

The weight average molecular weight (Mw) of the aforementioned trunk polymer (the polymer having phenolic hydroxyl groups) can be measured by Gel Permeation chromatography (GPC) and calculated in terms of polystyrene. The suitable Mw of the trunk polymer is from 2,000 to 200,000, particularly from 2,500 to 20,000. When the Mw is increased beyond 200,000, the solubility becomes poor and the resolution trends downward.

Since the line edge roughness shows a tendency to become worse the greater dispersion degree (Mw/Mn) the polymer has, or the higher-order multidisperse the polymer is, with respect to the molecular weight distribution, the suitable molecular-weight dispersion degree is from 1.0 to 3.0, preferably from 1.0 to 1.5, particularly preferably from 1.0 to 1.3.

Polymers having such small molecular-weight dispersion degrees can be obtained by making various changes in conditions for polymer synthesis (amounts of solvent and initiator used for polymerization) and conditions for polymer refining (kind and amount of reprecipitation solvent, and the number of times the reprecipitation operation is performed). For instance, the molecular weight can be controlled by properly choosing amounts of polymerization solvent and initiator used, and the dispersion degree of polymer can be reduced by selecting a solvent most suitable for reprecipitation or increasing the number of times the reprecipitation operation is repeated.

Specifically, it is preferable that a mixture of at least two kinds of solvents is used as reprecipitation solvent or a reprecipitation operation is carried out at least two times, and it is far preferable that a reprecipitation operation is repeated at least two times by using a mixture of at least two kinds of solvents as reprecipitation solvent. Alternatively, the intended polymer can be obtained by synthesizing polyvinylphenol having a low degree of molecular-weight dispersion via a living anion, living radical or living cation polymerization method, and then making the polyvinylphenol undergo acetalation with alkyl vinyl ethers.

As the alkyl vinyl ethers used for acetalation reaction, compounds represented by the following formula (A) are suitable:

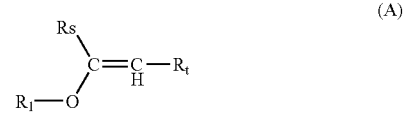

(A)

wherein $R^1$ represents an open-chain alkyl group which may have a substituent, a cyclic alkyl group which may have a substituent, an aryl group which may have a substituent, or an aralkyl group which may have a substituent, and wherein Rs and Rt each independently represents an open-chain alkyl group which may have a substituent, a cyclic alkyl group which may have a substituent.

The open-chain alkyl group suitable as $R^1$, which may have a substituent, may be a straight-chain or branched alkyl group containing 1 to 20 carbon atoms, preferably 1 to 18 carbon atoms, with examples including a methyl group, an ethyl group, an n-propyl group, an i-propyl group, an n-butyl group, an i-butyl group, a t-butyl group, an n-pentyl group, an i-pentyl group, a t-pentyl group, an n-hexyl group, an i-hexyl group, a t-hexyl group, an n-heptyl group, an i-heptyl group, a t-heptyl group, an n-octyl group, an i-octyl group, a t-octyl group, an n-nonyl group, an i-nonyl group, a t-nonyl group, an n-decyl group, an i-decyl group, a t-decyl group, an n-undecyl group, an i-undecyl group, an n-dodecyl group, an 1-dodecyl group, an n-tridecyl group, an i-tridecyl group, an n-tetradecyl group, an i-tetradecyl group, an n-pentadecyl group, an i-pentadecyl group, an n-hexadecyl group, an i-hexadecyl group, an n-heptadecyl group, an i-heptadecyl group, an n-octadecyl group, an i-octadecyl group, an n-nonadecyl group and an i-nonadecyl group.

These groups each may have a substituent as recited hereinafter.

The cyclic alkyl group suitable as $R^1$, which may have a substituent, is a cyclic alkyl group containing 3 to 20 carbon atoms, preferably 3 to 18 carbon atoms, wherein a ring may be formed of up to 20 carbon atoms or a ring formed may have a substitutent.

Examples of such a cyclic alkyl group include a cyclopropyl group, a cyclobutyl group, a cyclopentyl group, a cyclohexyl group, a cycloheptyl group, a cyclooctyl group, a cyclononyl group, a cyclodecyl group, a cycloundecyl group, a cyclododecyl group, a cyclotridecyl group, a cyclotetradecyl group, a cyclopentadecyl group, a cyclohexadecyl group, a cycloheptadecyl group, a cyclooctadecyl group, a cyclononadecyl group, 4-cyclohexylcyclohexyl, a 4-n-hexylcyclohexyl group, a pentanylcyclohexyl group, a hexyloxycyclohexyl group and a pentanyloxycyclohexyl group. Substituted cyclic alkyl groups other than the examples recited above are also usable as $R^1$ as far as they are within the scope mentioned above.

Those groups each may have a substituent as recited hereinafter.

The aryl group suitable as $R^1$, which may have a substituent, is an aryl group containing 6 to 30 carbon atoms, preferably 6 to 25 carbon atoms, with examples including a phenyl group, a tolyl group, a xylyl group, an ethylphenyl group, a propylphenyl group, a methoxyphenyl group, an ethoxyphenyl group, a propyloxyphenyl group, a 4-cyclopentylphenyl group, a 4-cyclooctanylphenyl group, a 2-cyclopentylphenyl group, a 2-cyclohexylphenyl group, a 2-cycloheptenylphenyl group, a 2-cyclooctanylphenyl group, a 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentylphenyl group, a 4-n-hexylphenyl group, a 4-n-heptenylphenyl-group, a 4-n-octanylphenyl group, a 2-n-pentylphenyl group, a 2-n-hexylphenyl group, n-2-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-di-isopropylphenyl group, a 2,3-di-isopropylphenyl group, a 2,4-di-isopropylphenyl group, a 3,4-di-isopropylphenyl group, a 3,6-di-t-butylphenyl group, a 2,3-di-t-butylphenyl group, a 2,4-di-t-butylphenyl group, a 3,4-di-t-butylphenyl group, a 2,6-di-n-butylphenyl group, a 2,3-di-n-butylphenyl group, a 2,4-di-n-butylphenyl group, a 3,4-di-n-butylphenyl group, a 2,6-di-1-butylphenyl group, a 2,3-di-1-butylphenyl group, a 2,4-di-1-butylphenyl group, a 3,4-di-1-butylphenyl group, a 2,6-di-t-amylphenyl group, a 2,3-di-t-amylphenyl group, a 2,4-di-t-amylphenyl group, a 3,4-di-t-amylphenyl group, a 2,6-di-1-amylphenyl group, a 2,3-di-1-amylphenyl group, a 2,4-di-1-amylphenyl group, a 3,4-di-1-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isobornylphenyl group, a 3-isobornylphenyl group, a 2-isobornylphenyl group, a 4-cyclopentyloxyphenyl group, a 4-cyclohexyloxyphenyl group, a 4-cycloheptenyloxyphenyl group, a 4-cyclooctatyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentyloxyphenyl group, a 4-n-hexyloxyphenyl group, a 4-n-heptenyloxyphenyl group, a 4-n-octanyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-di-isopropyloxyphenyl group, a 2,3-di-isopropyloxyphenyl group, a 2,4-di-isopropyloxyphenyl group, a 3,4-di-isopropyloxyphenyl group, a 2,6-di-t-butyloxyphenyl group, a 2,3-di-t-butyloxyphenyl group, a 2,4-di-t-butyloxyphenyl group, a 3,4-di-t-butyloxyphenyl group, a 2,6-di-n-butyloxyphenyl group, a 2,3-di-n-butyloxyphenyl group, a 2,4-di-n-butyloxyphenyl group, a 3,4-di-n butyloxyphenyl group, a 2,6-di-n-butyloxyphenyl group, a 2,3-di-1-butyloxyphenyl group, a 2,4-di-1-butyloxyphenyl group, a 3,4-di-1-butyloxyphenyl group, a 2,6-di-t-amyloxyphenyl group, a 2,3-di-t-amyloxyphenyl group, a 2,4-di-t-amyloxyphenyl group, a 3,4-di-t-mayloxyphenyl group, a 2,6-di-1-amyloxyphenyl group, a 2,3-di-1-amyloxyphenyl group, a 2,4-di-1-amyloxyphenyl group, a 3,4-di-1-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isobornyloxyphenyl group, a 3-isobornyloxyphenyl group and a 2-isobornyloxyphenyl group. These groups each may further have a substituent. So the aryl group suitable as $R^1$ is not limited to the groups recited above.

Those groups may further be substituted with substituents as recited hereinafter.

The aralkyl group suitable as $R^1$, which may have a substituent, is an aralkyl group containing 7 to 30, preferably 8 to 25, carbon-atoms, with examples including a phenylethyl group, a tolylphenylethyl group, "a xylylphenylethyl group, an ethylphenylethyl group, a propylphenylethyl group, a 4-cyclopentylphenylethyl group, a 4-cyclohexylphenylethyl group, a 4-cycloheptenylphenylethyl group, a 4-cyclooctanylphenylethyl group, a 2-cyclopentylphenylethyl group, a 2-cyclohexylphenylethyl group, a 2-cycloheptenylphenylethyl group, a 2-cyclooctanylphenylethyl group, a 3-cyclopentylphenylethyl group, a 3-cyclohexylphenylethyl group, a 3-cycloheptenylphenylethyl group, a 3-cyclooctanylphenylethyl group, a 4-cyclopentyloxyphenylethyl group, a 4-cyclohexyloxyphenylethyl group, a 4-cycloheptenyloxyphenylethyl group, a 4-cylooctanyloxyphenylethyl group, a 2-cyclopentyloxyphenylethyl group, a 2-cyclohexyloxyphenylethyl group, a 2-cycloheptenyloxyphenylethyl group, a 2-cylooctanyloxyphenylethyl group, a 3-cyclopentyloxyphenylethyl group, a 3-cyclohexyloxyphenylethyl group, a 3-cyloheptenyloxyphenylethyl group, a 3-cylooctanyloxyphenylethyl-group, a 4-n-pentylphenylethyl group, a 4-n-hexylphenylethyl group, a 4-n-heptenylphenylethyl group, a 4-n-octanylphenylethyl group, a 2-n-pentylphenylethyl group, a 2-n-hexylphenylethyl group, a 2-n-heptenylphenylethyl group, a 2-n-octanylphenylethyl group, a 3-n-pentylphenylethyl group, a 3-n-hexylphenylethyl group, a 3-n-heptenylphenylethyl group, a 3-n-octanylphenylethyl group, a 2,6-di-isopropylphenylethyl group, a 2,3-di-isopropylphenylethyl group, a 2,4-di-isopropylphenylethyl group, a 3,4-do-isopropylphenylethyl group, a 2,6- di-t-butylphenylethyl group, a 2,3-di-t-butylphenylethyl group, a 2,4-di-t-butylphenylethyl group, a 3,4-di-t-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-1-butylphenylethyl group, a 2,3-di-1-butylphenylethyl group, a 2,4-di-1-butylphenylethyl group, a 3,4-di-1-butylphenylethyl group, a 2,6-di-t-amylphenylethyl group, a 2,3-di-t-amylphenylethyl group, a 2,4-di-t-amylphenylethyl group, a 3,4-di-t-amylphenylethyl group, a 2,6-di-1-amylphenylethyl group, a 2,3-di-1-amylphenylethyl group, a 2,4-di-1-amylphenylethyl group, a 3,4-di-1-amylphenylethyl group, a 2,6-di-n-pentylphenylethyl group, a 2,3-di-n-pentylphenylethyl group, a 2,4-di-n-pentylphenylethyl group, a 3,4-di-n-pentylphenylethyl group, a 4-adamantylphenylethyl group, a 3-adamantylphenylethyl group, a 2-adamantylphenylethyl group, a 4-isobornylphenyl ethyl group, a 3-isobornylphenyl ethyl group, a 2-isobornylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyl-oxyphenylethyl group, a 3-cycloheptenyloxyphenylethyl group, a 3-cyclooctanylphenylethyl group, a 4-n-pentyloxyphenylethyl group, a 4-n-hexyloxyphenylethyl group, a 4-n-heptenyloxyphenylethyl group, a 4-n-octanyloxyphenylethyl group, a 2-n-pentyloxyphenylethyl group, a 2-n-hexyloxyphenylethyl group, a 2-n-heptenyloxyphenylethyl group, a 2-n-octanyloxyphenylethyl group, a 3-n-pentyloxyphenylethyl group, 3-n-hexyloxyphenylethyl group, a 3-n-heptenyloxyphenylethyl group, a 3-n-octanyloxyphenylethyl group, a 2,6-di-isopropylphenylethyl group, a 2,3-di-isopropylphenylethyl group, a 2,4-di-isopropyloxyphenylethyl group, a 3,4-di-isopropyloxyphenylethyl group, a 2,6-di-t-butyloxyphenylethyl group, a 2,3-di-t-butyloxyphenylethyl group, a 2,4-di-t-butyloxyphenylethyl group, a 3,4-di-t-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-1-butyloxyphenylethyl group, a 2,3-di-1-butyloxyphenylethyl group, a 2,4-di-1-butyloxyphenylethyl group, a 3,4-di-1-butyloxyphenylethyl group, a 2,6-di-t-amyloxyphenylethyl group, a 2,3-di-t-amyloxyphenylethyl group, a 2,4-di-t-amyloxyphenylethyl group, a 3,4-di-t-amyloxyphenylethyl group, a 2,6-di-1-amyloxyphenylethyl group, a 2,3-di-1-amyloxyphenylethyl group, a 2,4-di-1-amyloxyphenylethyl group, a 3,4-di-1-amyloxyphenylethyl group, a 2,6-di-n-pentyloxyphenylethyl group, a 2,3-di-n-pentyloxyphenylethyl group, a 2,4-di-n-pentyloxyphenylethyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isobornyloxyphenylethyl group, a 3-isobornyloxyphenylethyl group and a 2-isobornyloxyphenylethyl group. Further, groups formed by replacing the alkali groups of those groups with methyl, propyl or butyl groups may be included in examples of an aralkyl group suitable as $R^1$.

These groups may further have substituents as mentioned below.

Examples of substituents the aforementioned groups may have include a hydroxyl group, halogen atoms (fluorine, chlorine, bromine, iodine), a nitro group, a cyano group, the alkyl groups as recited hereinbefore, alkoxy groups (e.g., methoxy, ethoxy, hydroxyethoxy, propoxy, hydroxypropoxy, n-butoxy, isobutoxy, sec-butoxy, t-butoxy), alkoxycarbonyl groups (e.g., methoxycarbonyl, ethoxycarbonyl), aralkyl groups (e.g., benzyl, phenetyl, cumyl), aralkyloxy groups, acyl groups (e.g., formyl, acetyl, butyryl, benzoyl, valeryl), acyloxy groups (e.g., butyryloxy), the alkenyl groups as recited hereinbefore, alkenyloxy groups (e.g., vinyloxy, propenyloxy, allyloxy, butenyloxy), the aryl groups as recited hereinbefore, aryloxy groups (e.g., phenoxy), and aryloxycarbonyl groups (e.g., benzoyloxy).

Those substituents may further be substituted as far as the number of carbon atoms in each of the substituted ones, such as substituted aryl groups and substituted aralkyl groups, is within the range defined above.

Examples of a compound represented by formula (A) include ethyl vinyl ether, n-propyl vinyl ether, isopropyl vinyl ether, n-butyl vinyl ether, t-butyl vinyl ether, cyclohexyl vinyl ether, n-hexyl vinyl ether, benzyl vinyl ether, cyclohexylethyl vinyl ether, phenoxyethyl vinyl ether, cyclohexylphenoxyethyl vinyl ether, 4-carbonylcyclohexylphenoxyethyl vinyl ether, t-butylcyclohexylcarbonyloxyethyl vinyl ether, cyclohexylthioethyl vinyl ether, and n-butylcyclohexylcarbonyloxyethyl vinyl ether. However, the compounds are not limited to these examples, but may include any vinyl ethers as far as they can substantially undergo acetalation reaction with phenolic hydroxyl groups in polymers. Of those compounds, t-butyl vinyl ether, isopropyl vinyl ether and cyclohexyl vinyl ether, especially t-butyl vinyl ether, are preferred over the others.

Moreover, the following compounds are also preferable:

methyl isopropenyl ether, butyl isopropenyl ether, phenyl isopropenyl ether, benzyl isopropenyl ether, cyclohexyl isopropenyl ether, cyclohexylphenoxyethyl isopropenyl ether.

The suitable quantity of at least two kinds of alkyl vinyl ether compounds used in the reaction is from 5 to 95 mole %, preferably from 10 to 60 mole %, particularly preferably from 15 to 50 mole %, based on the total phenolic hydroxyl groups contained in the polymer having phenolic hydroxyl groups.

The organic solvent used in the reaction has no particular restrictions so far as it is an inactive solvent. Specifically, propylene glycol methyl ether acetate (PGMEA), 2-heptanone, ethyl ethoxypropionate, methyl pyruvate, ethyl pyruvate and tetrahydrofuran are each usable as such a solvent. Of these solvents, PGMEA and 2-heptanone are preferred over the others.

The reaction solvent is generally used in the amount of 100 to 1,000 parts by weight, based on 100 parts by weight of polymer having phenolic hydroxyl groups.

Polymers applicable to the present acid-decomposable polymer (a) can be used alone or as a combination of two or more thereof. For instance, a combination of acid-decomposable polymers (a) synthesized from two or more kinds of phenolic hydroxyl-containing polymers different in molecular weight and compositional ratio, or a combination of two or more kinds of acid-decomposable polymers different in acetal protection rate can be chosen for the purpose of enhancing resist performances including sensitivity, resolution and profile.

In synthesizing an acid-decomposable polymer (a), a polymer having phenolic hydroxyl groups is dissolved in an organic solvent as mentioned above (a solvent inactive in acetalation reaction), and then a water content in the resulting solution is removed by reduced-pressure distillation, if needed, and thereto two or more kinds of alkyl vinyl ether compounds are added. The alkyl vinyl ether compounds may be added simultaneously or in succession. The acetalation reaction proceeds from the addition of an acid catalyst.

Any of inorganic and organic acids can be used as the acid catalyst. However, organic acids are preferable to inorganic ones because the former acids leave no metallic impurity residue. And the most favorable ones of all organic acids are p-toluenesulfonic acid and pyridinium p-toluenesulfonate.

For the purpose of ceasing the acetalation reaction, it is appropriate to effect neutralization with a basic compound. If the neutralization is not carried out, there is a fear that the residual acid impairs the storage stability of resist. The basic compound usable herein has no particular restriction so far as it can neutralize the acid added as the catalyst and the salt formed can be removed in a washing step. Of all basic compounds, organic basic compounds are favorable because they leave no metallic impurity residue. Examples thereof include triethylamine, trimethylamine, pyridine, aminopyridine, piperazine and imidazole. Among them, triethylamine and pyridine are most advantageous.

After completion of the acetalation reaction and subsequent neutralization, it is preferable to eliminate the salt remaining in the reaction system by means of ultrapure water.

Examples of an acid-decomposable polymer (a) having repeating units represented by formulae (I), (II) and (III) are illustrated below.

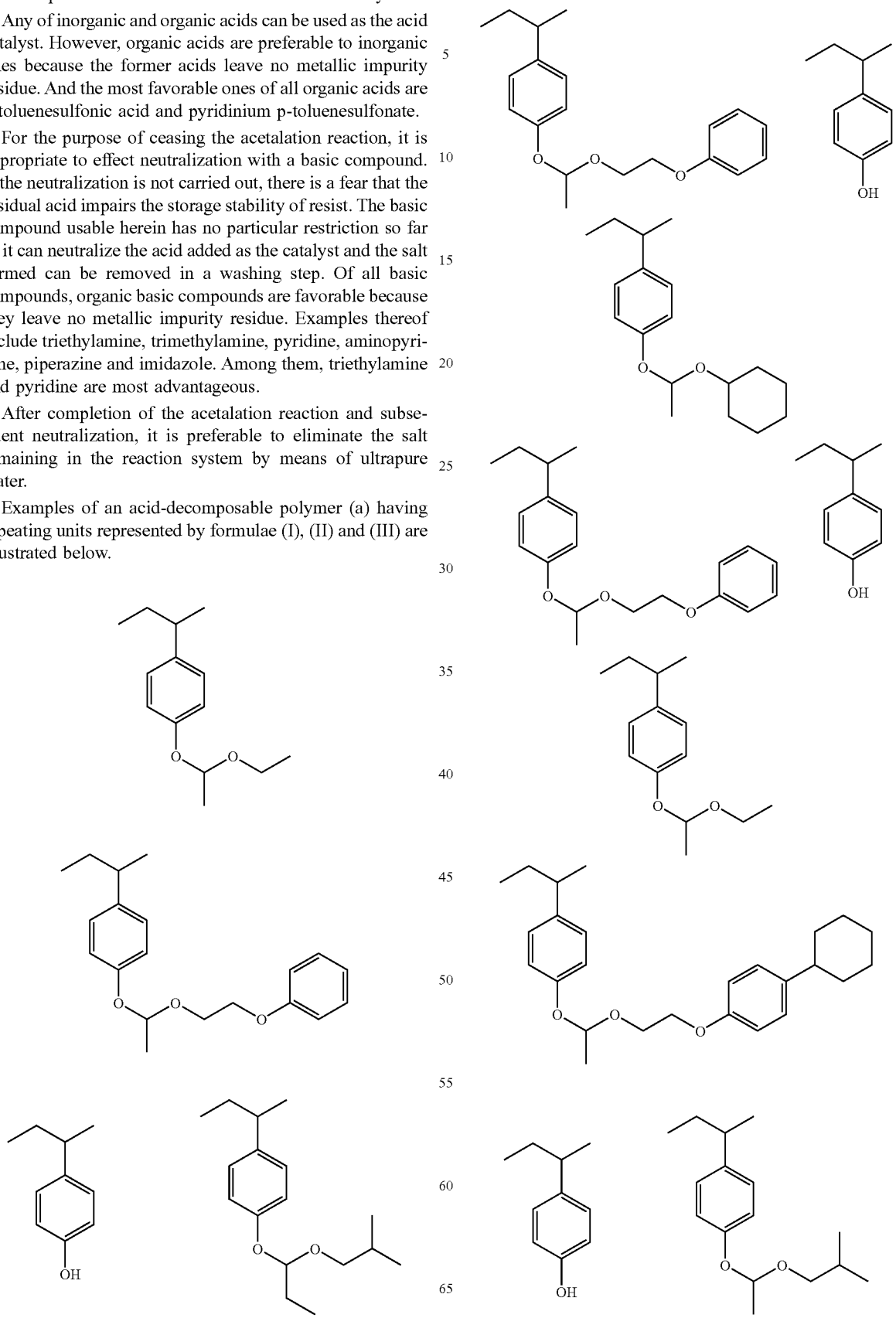

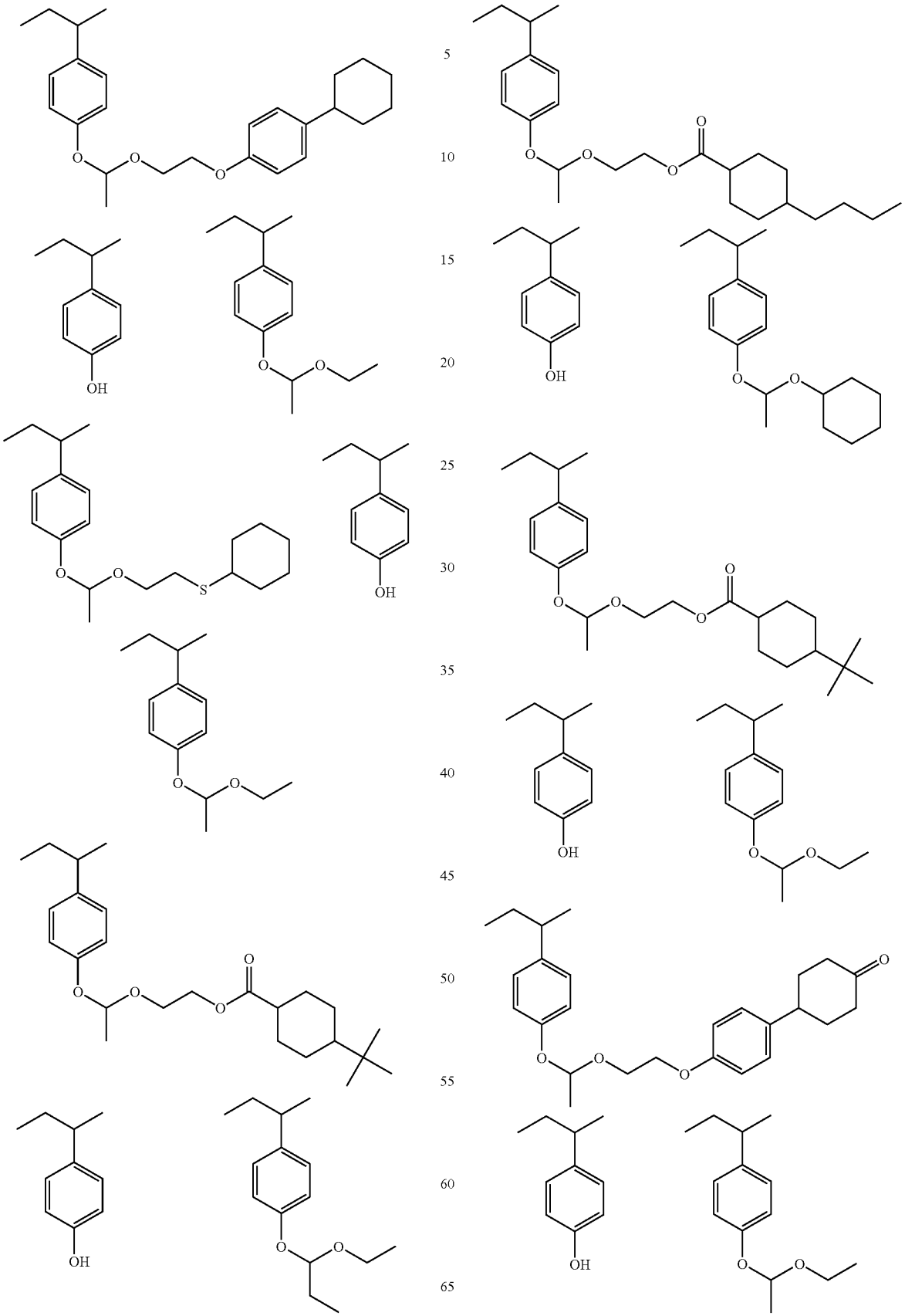

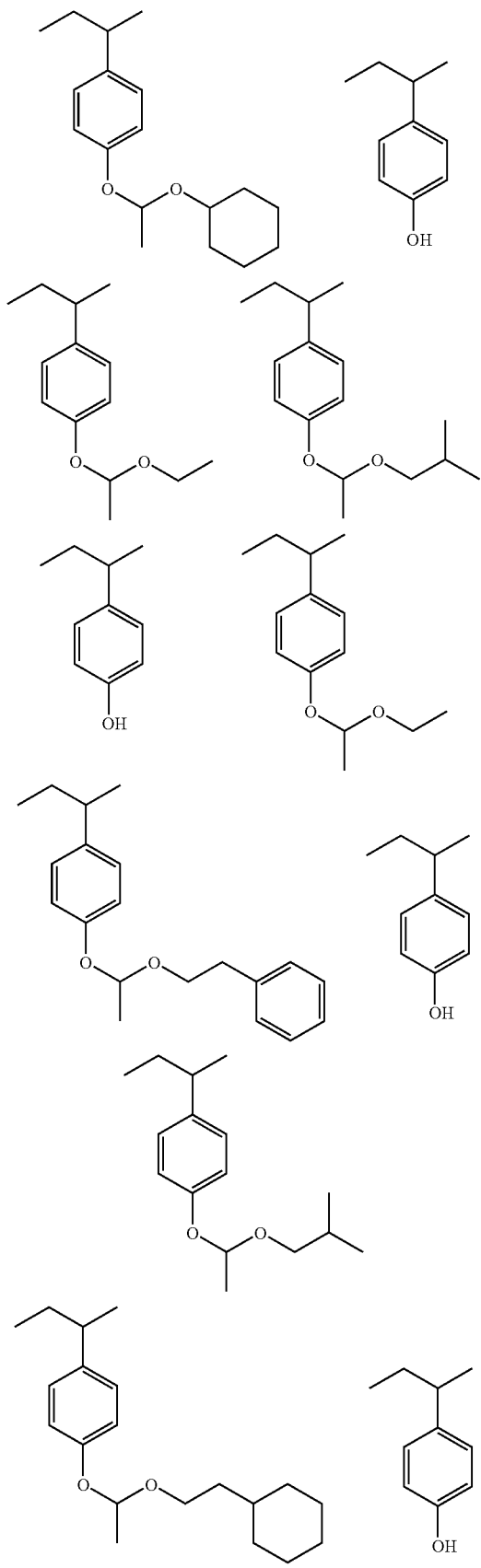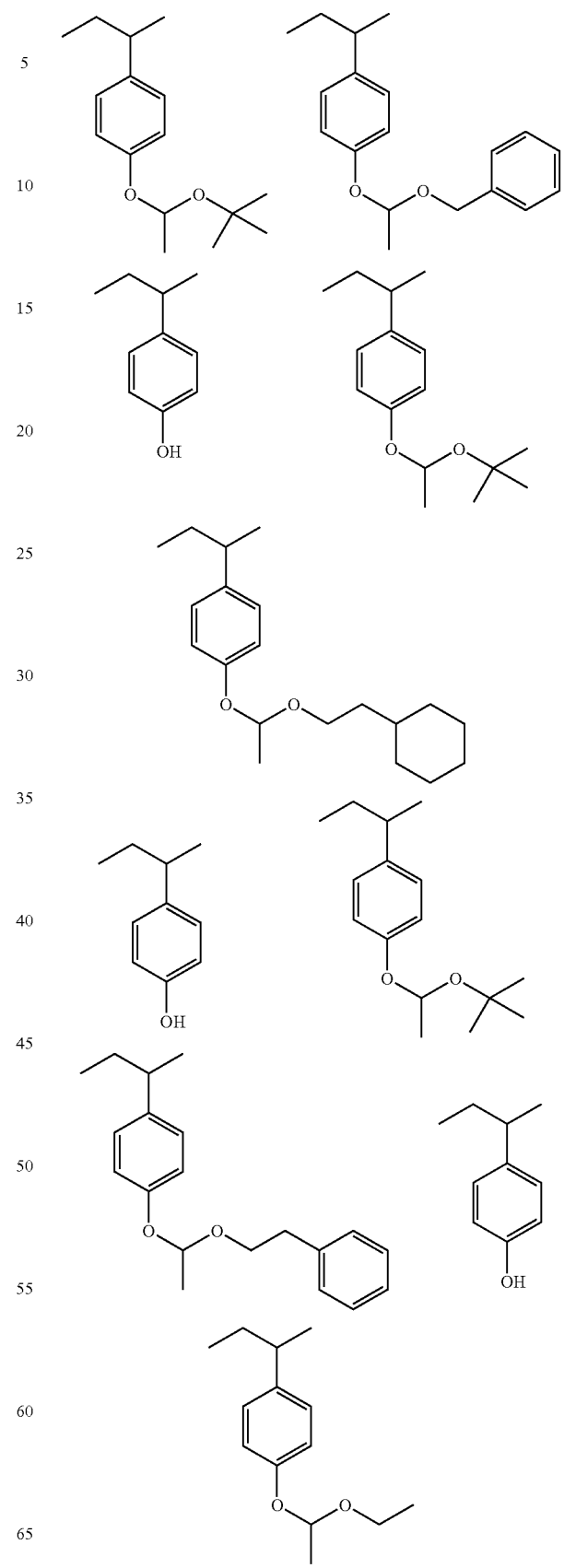

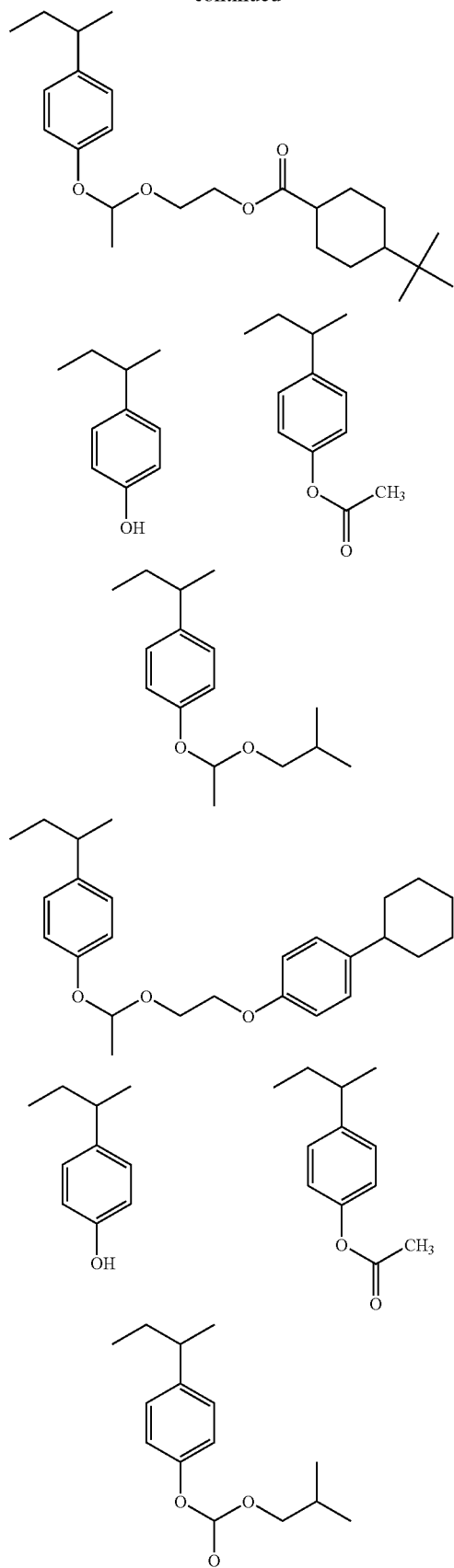
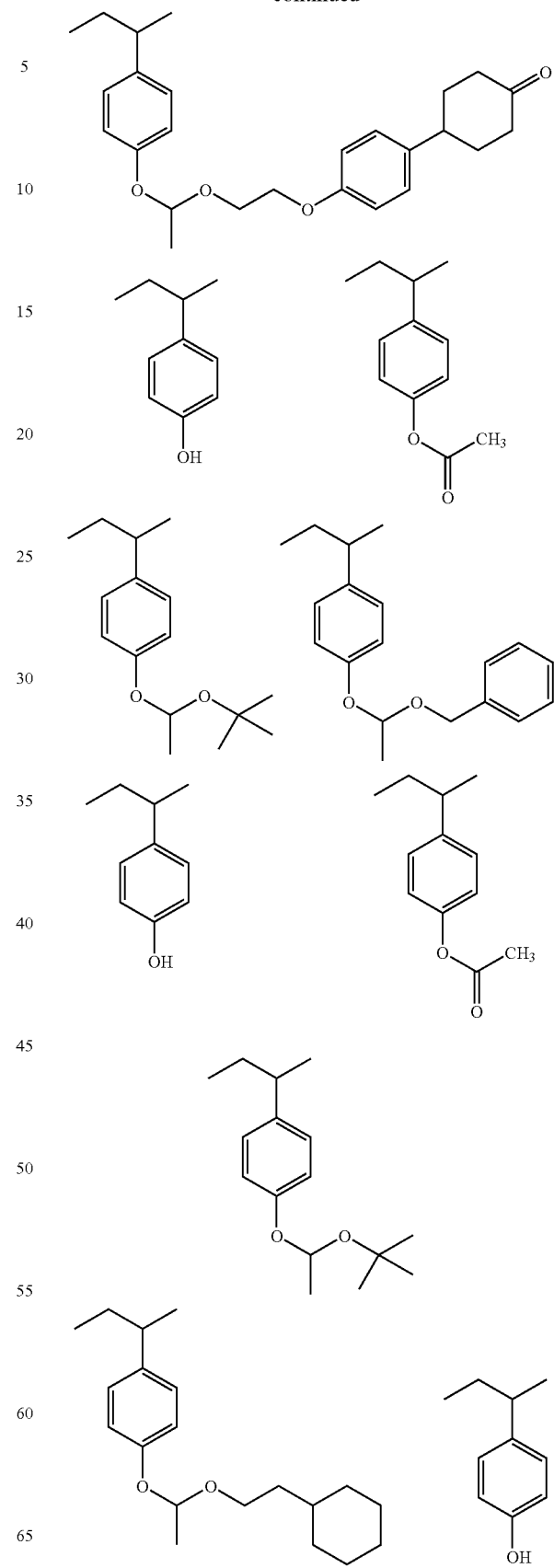

21
-continued
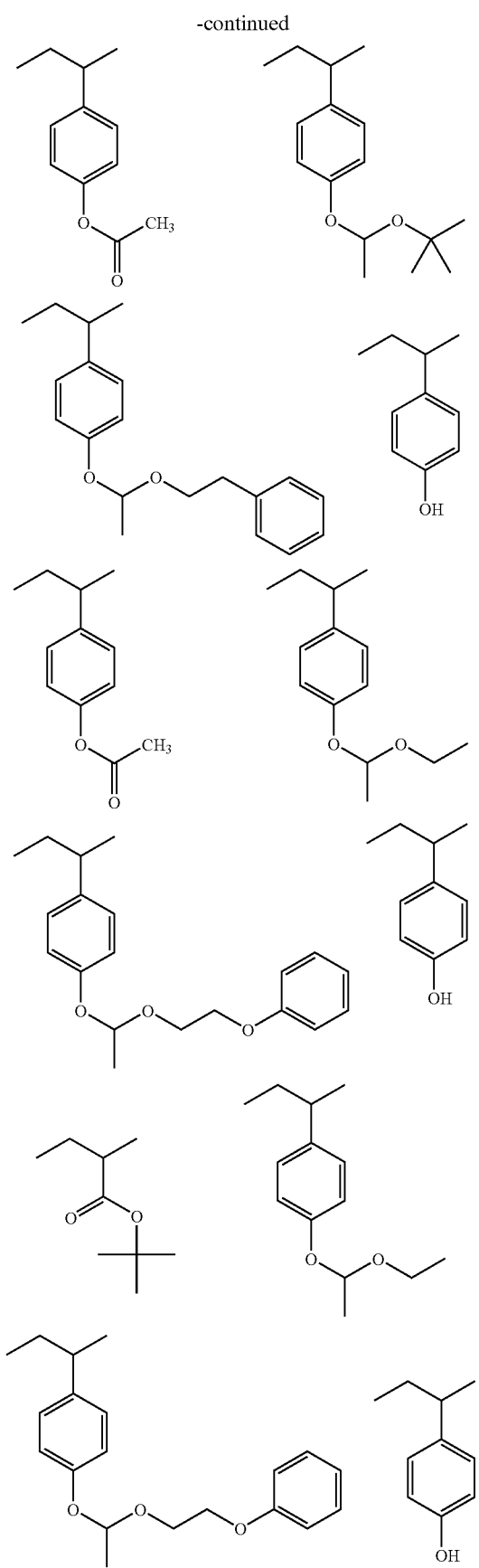
22
-continued
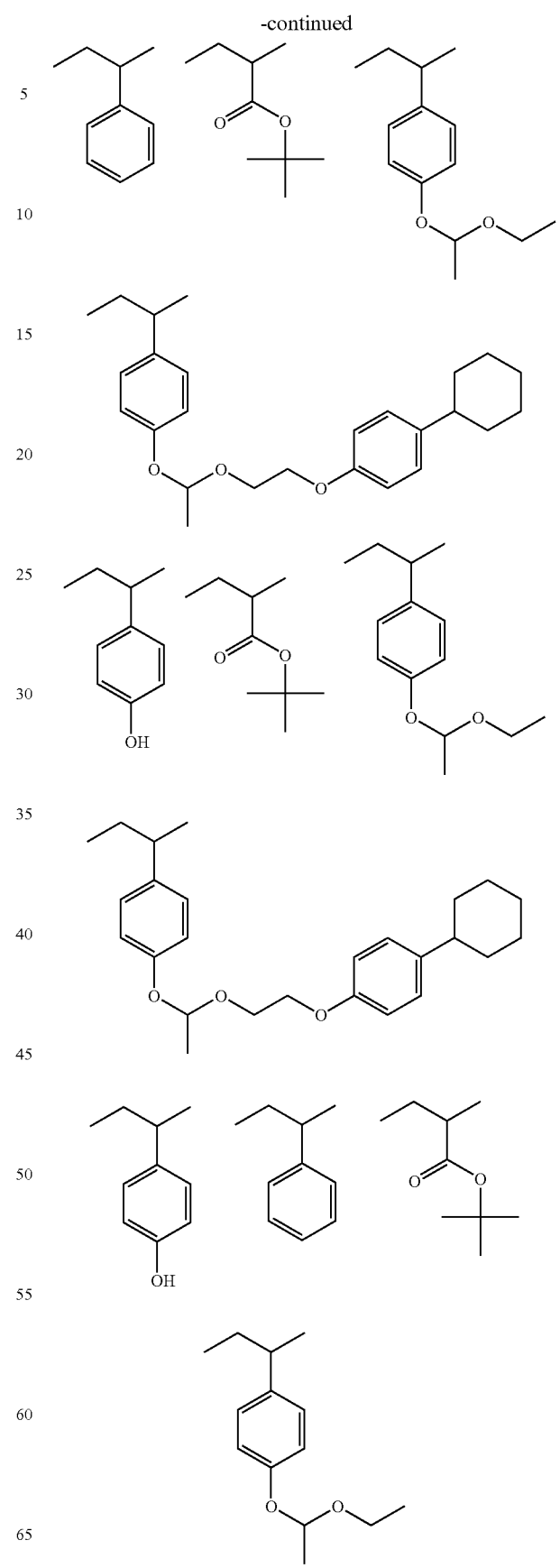

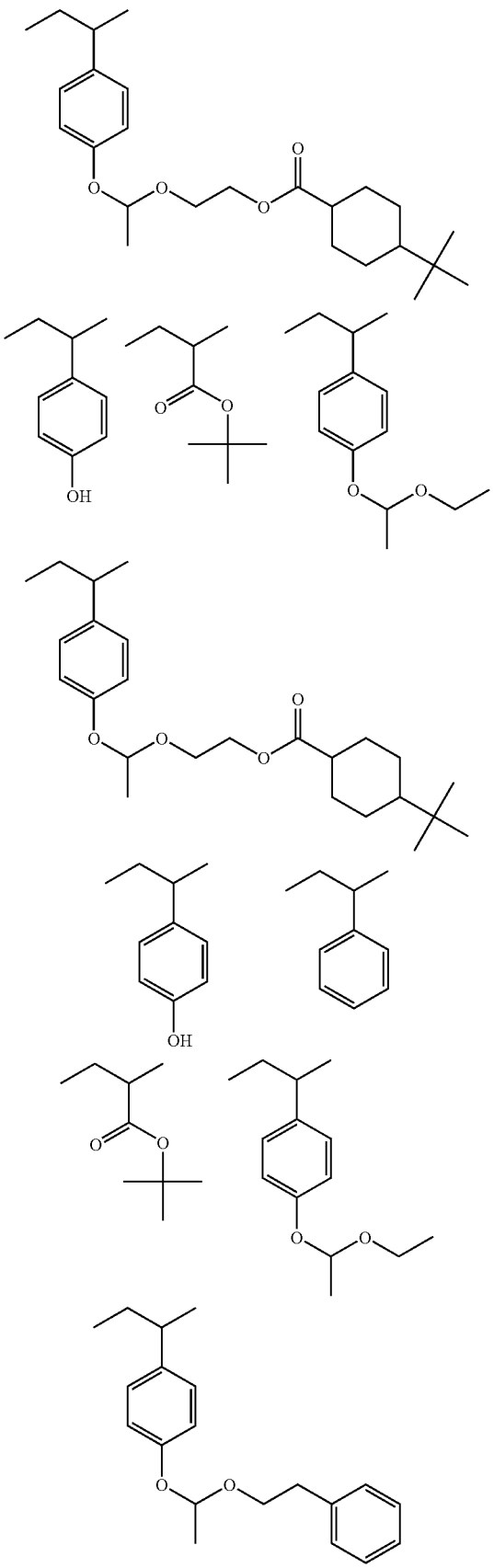
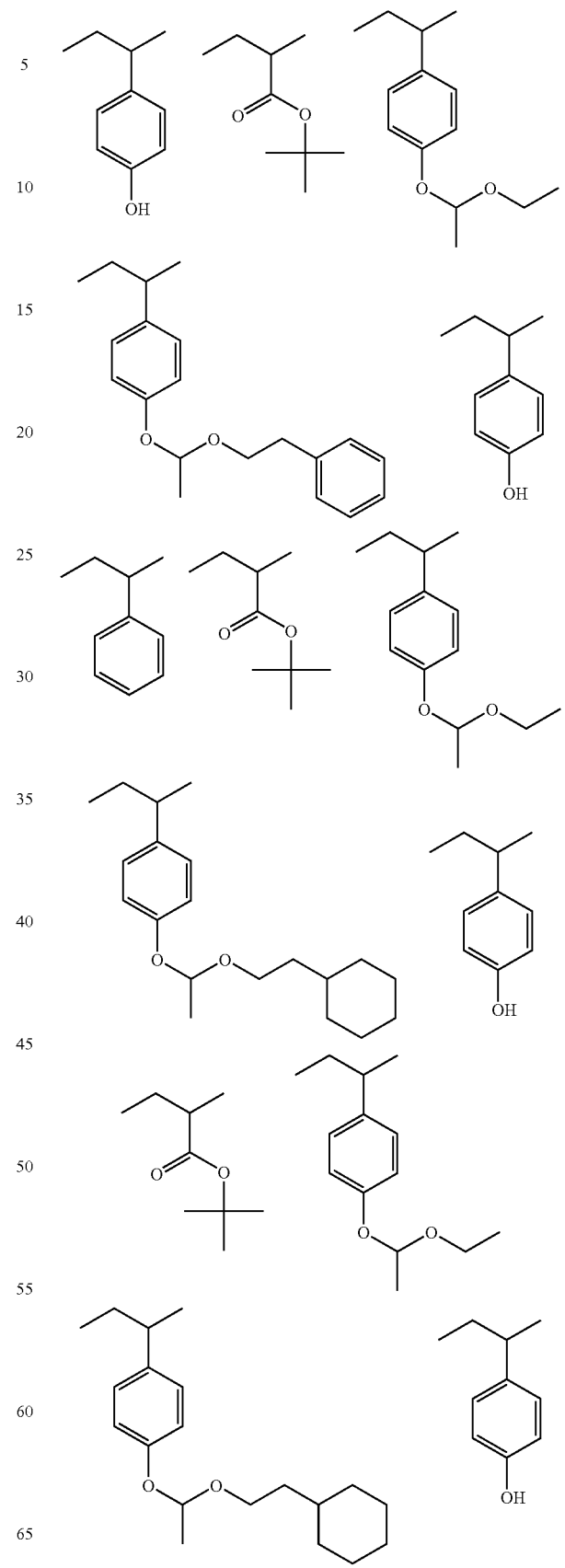

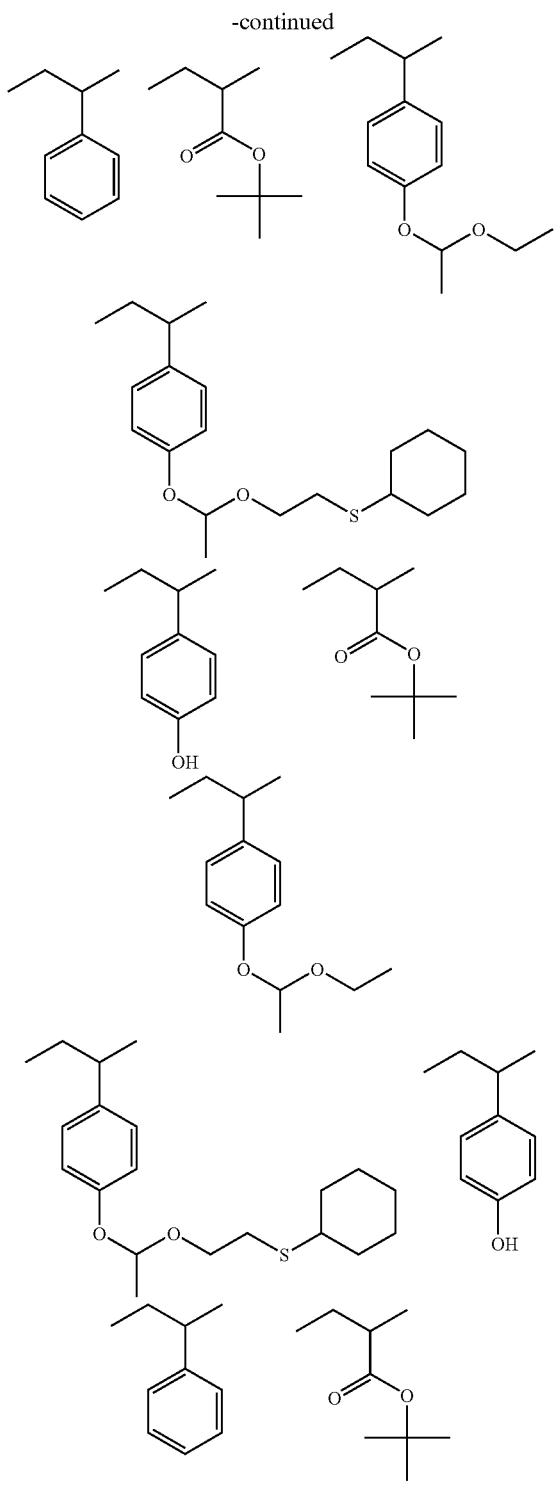

The content of acid-decomposable polymer (a) in the present resist composition is generally from 70 to 80% by weight, preferably from 75 to 96% by weight, far preferably from 80 to 96% by weight, based on the total solids in the composition.

(b) Compound Capable of Generating Acid by Irradiation of Actinic Ray or Radiation (Hereinafter Referred to as "Photo-Acid Generator (b)", too)

The photo-acid generator (b) used in the invention can be selected appropriately from photo-initiators for cationic photo-polymerization, photo-initiators for radical photo-polymerization, photo-decoloring agents for dyes, photo-discoloring agents, compounds which are used in microresist and can generate acids when irradiated with known light (including 400–200 nm ultraviolet rays and far ultraviolet rays, particularly preferably g-ray, h-ray, i-ray and KrF excimer laser light), ArF excimer laser light (193 nm), $F_2$ excimer laser (157 nm), EUV (13 nm), electron beams, X-rays, molecular beams or ion beams, or mixtures of two or more thereof.

Examples of another photo-acid generator usable in the invention as a compound capable of generating an acid upon irradiation with an actinic ray or radiation include onium salts, such as diazonium salts, ammonium salts, phosphonium salts, iodonium salts, sulfonium salts, selenonium salts and arsonium salts; organic halogen compounds; organometallic/halogenated organic compounds; photo-acid generators having protective groups of o-nitrobenzyl type; compounds generating sulfonic acid by photolysis, typically iminosulfonate; disulfone compounds, diazoketosulfone and diazodisulfone compounds.

In addition, it is also possible to use polymers having main or side chains in which are introduced the groups or compounds capable of generating acids when irradiated with the foregoing light.

Further, the compounds capable of generating acids upon exposure to light as described in V. N. R. Pillai, *Synthesis*, (1), 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent No. 126,712 can be employed, too.

Of the compounds capable of generating acids upon irradiation with the foregoing actinic rays or radiation, the compounds illustrated below can be used to particular advantage.

(1) Trihalomethyl-substituted oxazole derivatives represented by the following formula (PAG1) or trihalomethyl-substituted s-triazine derivatives represented by the following formula (PAG2):

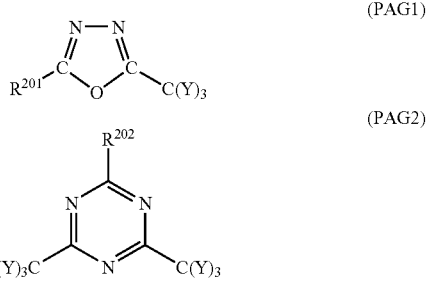

In the above formulae, $R^{201}$ represents a substituted unsubstituted aryl or alkenyl group, $R^{202}$ represents a substituted or unsubstituted aryl, alkenyl or alkyl group, or —C(Y)$_3$, and Y represents a chlorine or bromine atom.

Examples of those derivatives include the following compounds, but these examples should not be construed as limiting such derivatives.

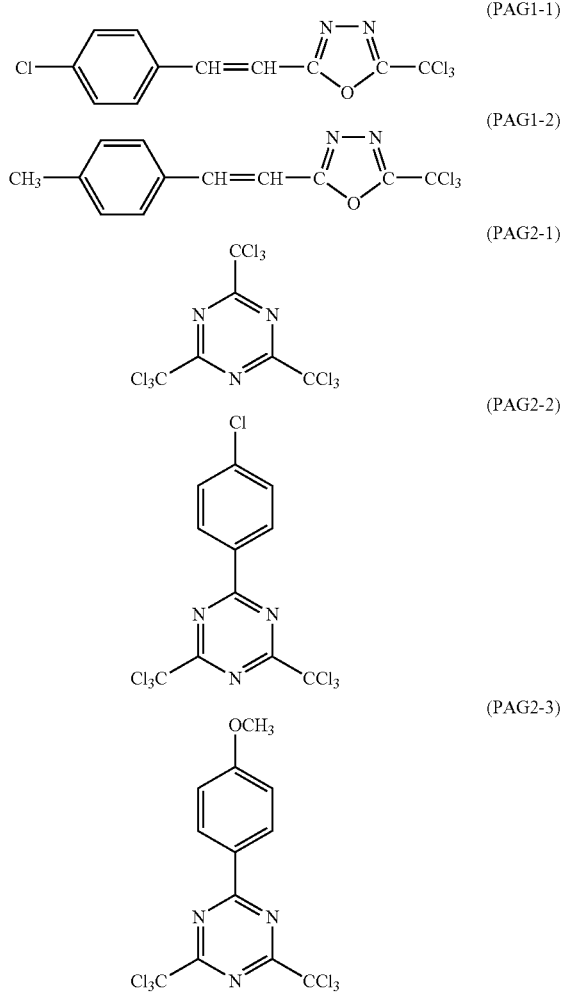

(2) Iodonium salts represented by the following formula (PAG3) or sulfonium salts represented by the following formula (PAG4):

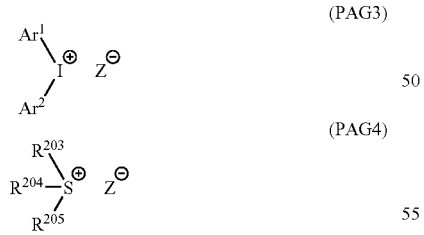

In the above formula, $Ar^1$ and $Ar^2$ each represents a substituted or unsubstituted aryl group independently, and $R^{203}$, $R^{204}$ and $R^{205}$ each represents a substituted or unsubstituted alkyl or aryl group independently.

And $Z^-$ represents a counter anion, with examples including $BF_4^-$, $AsF_6^-$, $PF_6^-$, $SbF_6^-$, $SiF_6^{2-}$, $ClO_4^-$, perfluoroalkanesulfonic acid anions such as $CF_3SO_3^-$, pentafluorobenzenesulfonic acid anion, condensed polynuclear aromatic sulfonic acid anions such as naphthalene-1-sulfonic acid anion, anthraquinonesulfonic acid anion, and dyes containing sulfonic acid groups. However, the counter anion of $Z^-$ should not be construed as being limited to those examples.

In addition, any two of $R^2 O3$, $R^{204}$ and $R^{205}$, and $Ar^1$ and $Ar^2$ may be combined with each other via their respective single bonds or substituent groups.

Examples of those onium salts are illustrated below, but the compounds illustrated below should not be construed as limiting photo-acid generators usable in the invention.

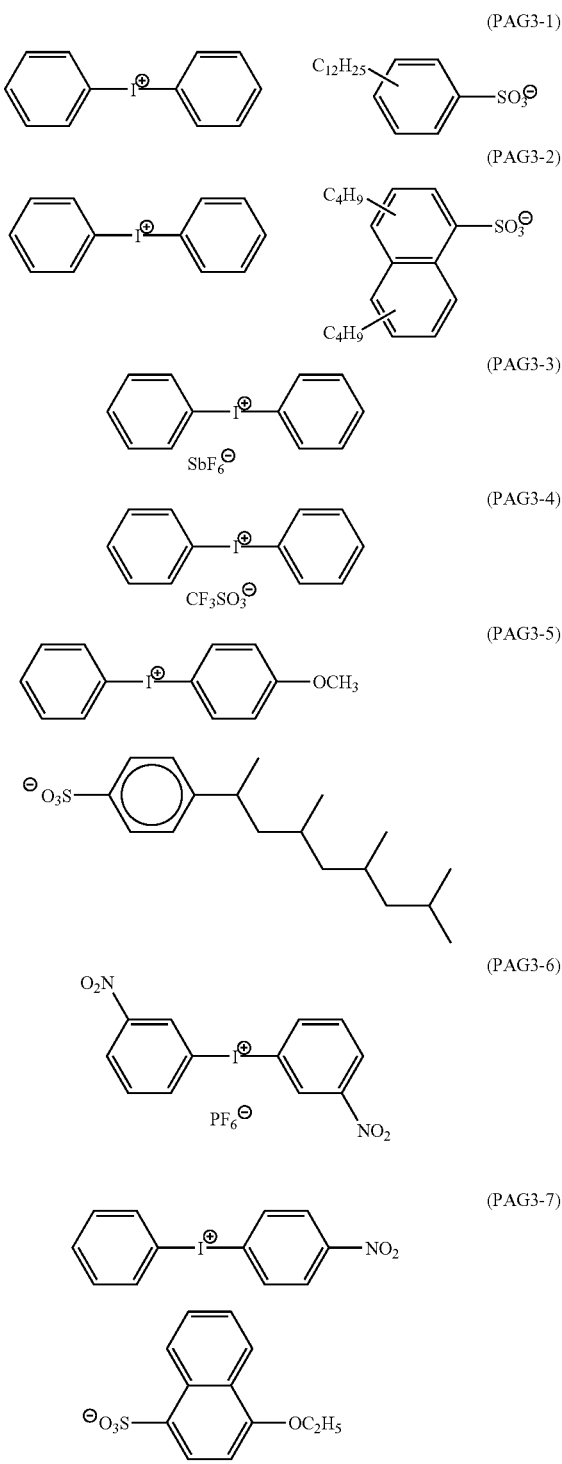

-continued
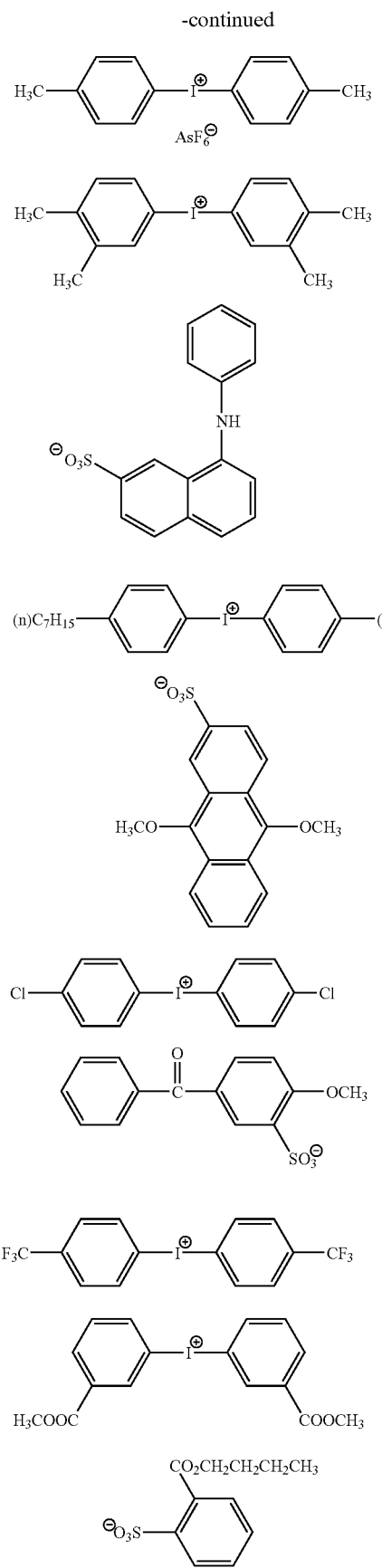
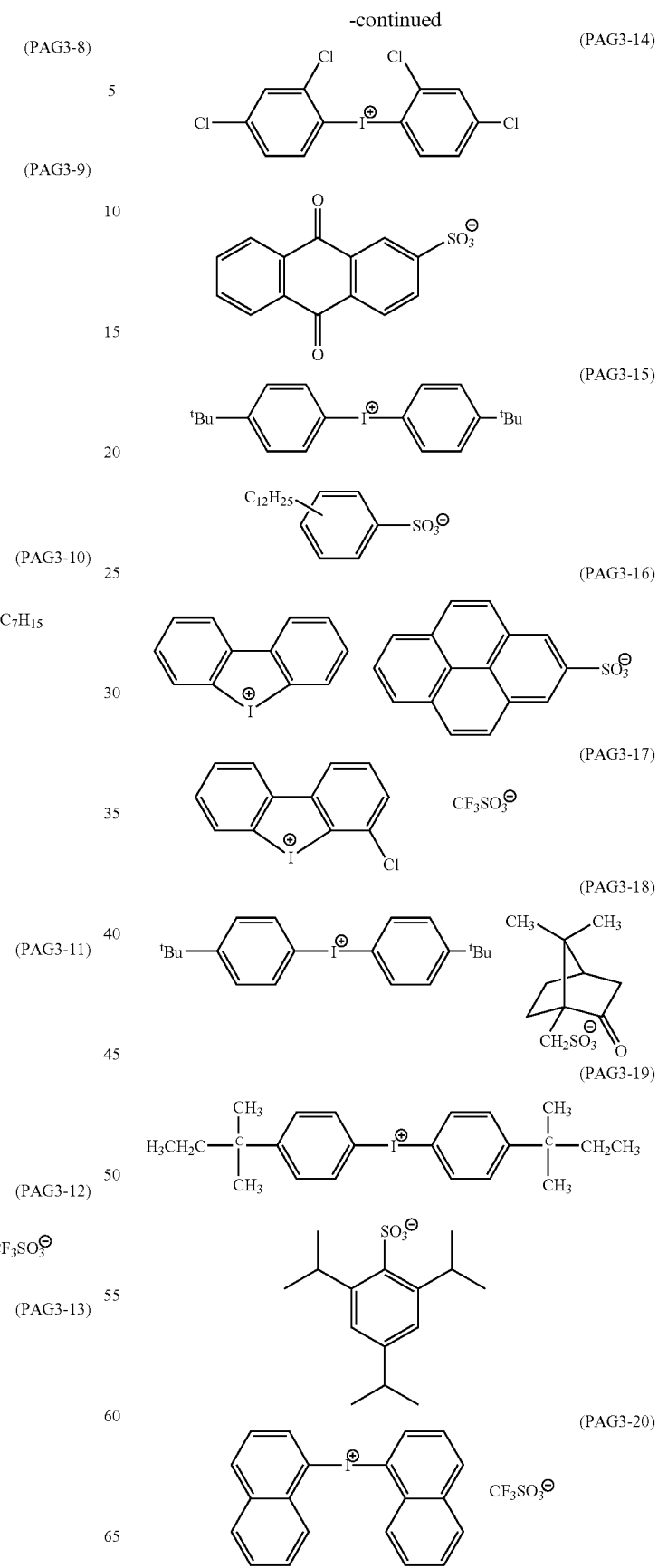

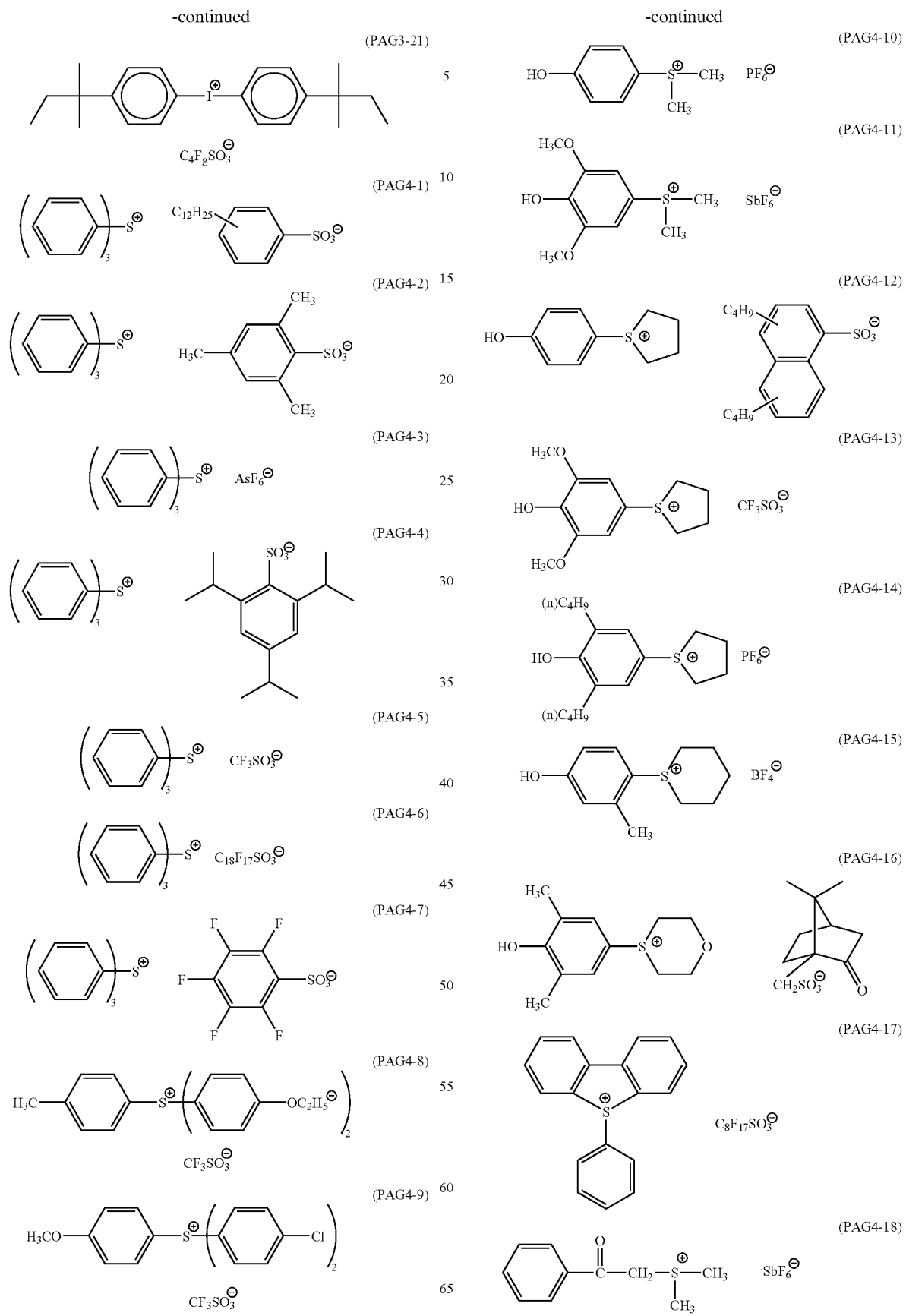

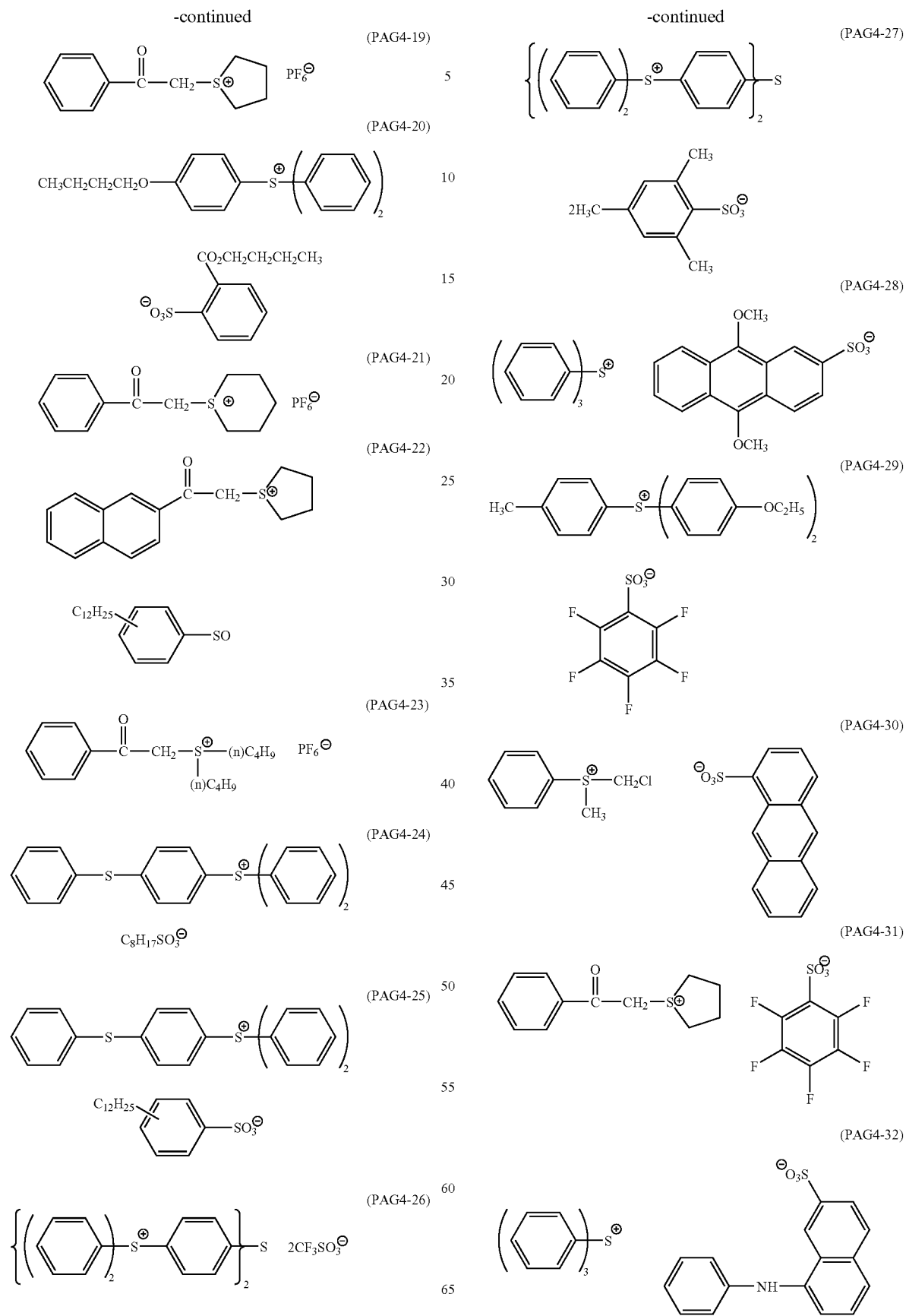

The onium salts represented by the foregoing formulae (PAG3) and (PAG4) are known compounds and can be synthesized using the methods as described in J. W. Knapczyk et al., *J. Am. Chem. Soc.*, 91, 145 (1969), A. L. Maycok et al., *J. Org. Chem.*, 35, 2532 (1970), E. Goethas et al., *Bull Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. No. 2,807,648 and 4,247,473, and JP-A-53-101331.

(3) Disulfone derivatives represented by the following formula (PAG5) or iminosulfonate derivatives represented by the following formula (PAG6): C

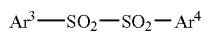
(PAG5)

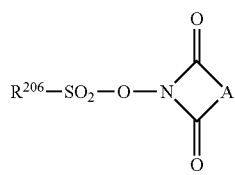
(PAG6)

In the above formulae, $Ar^3$ and $Ar^4$ each represents a substituted or unsubstituted aryl group independently, $R^{206}$ represents a substituted or unsubstituted alkyl or aryl group, and A represents a substituted or unsubstituted alkylene, alkenylene or arylene group.

The compounds illustrated below are examples of those derivatives, but these examples should not be construed as limiting photo-acid generators usable in the invention.

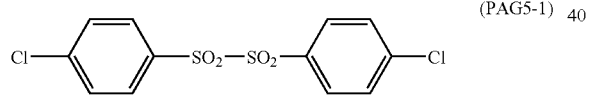
(PAG5-1)

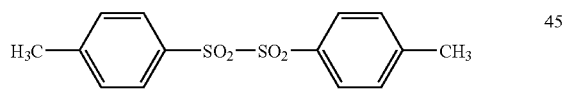
(PAG5-2)

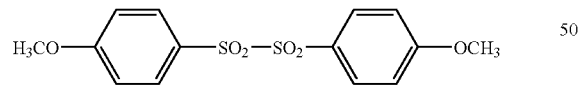
(PAG5-3)

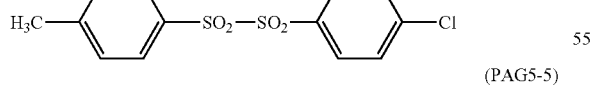
(PAG5-4)

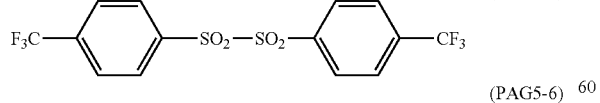
(PAG5-5)

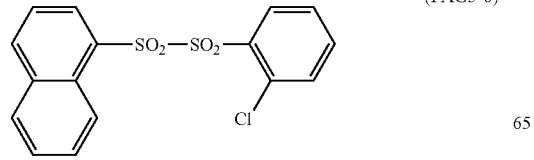
(PAG5-6)

-continued

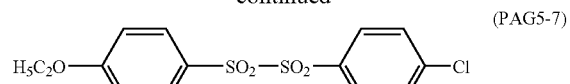
(PAG5-7)

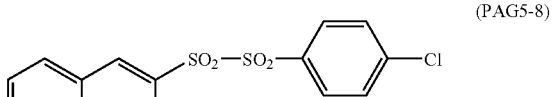
(PAG5-8)

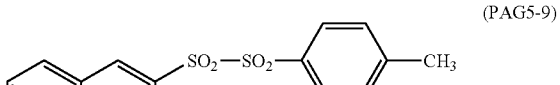
(PAG5-9)

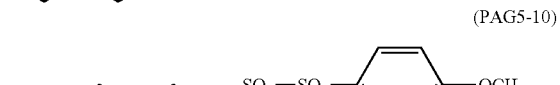
(PAG5-10)

(PAG5-11)

(PAG5-12)

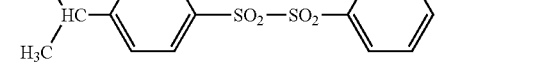
(PAG5-13)

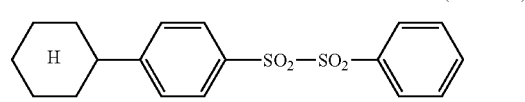
(PAG5-14)

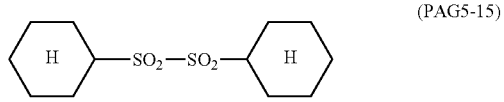
(PAG5-15)

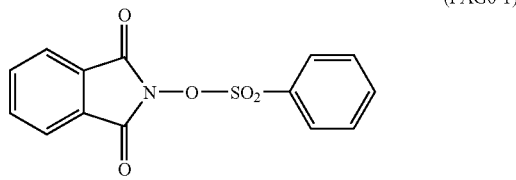
(PAG6-1)

-continued
(PAG6-2)
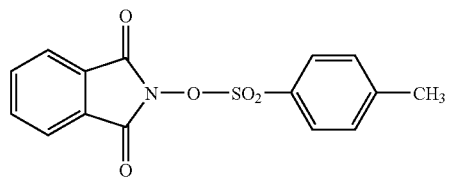
(PAG6-3)
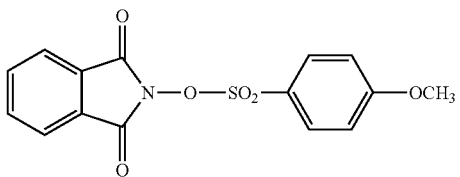
(PAG6-4)
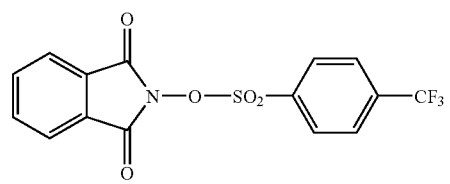
(PAG6-5)
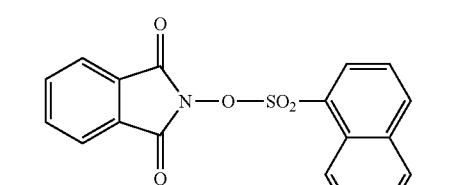
(PAG6-6)
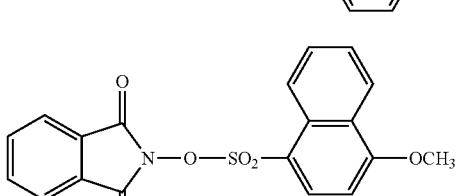
(PAG6-7)
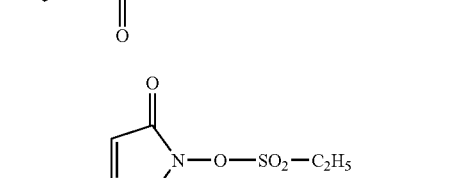
(PAG6-8)
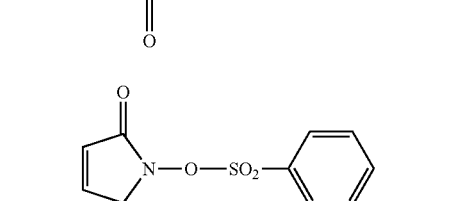
(PAG6-9)
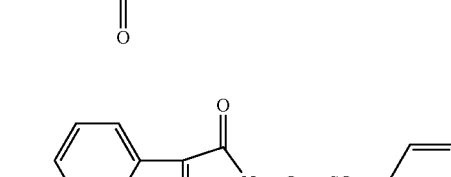
-continued
(PAG6-10)
(PAG6-11)
(PAG6-12)
(PAG6-13)
(PAG6-14)
(PAG6-15)
(PAG6-16)
(PAG6-17)

(PAG6-18)

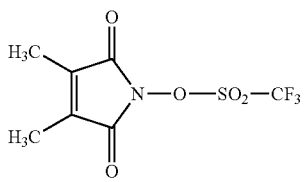

(PAG6-19)

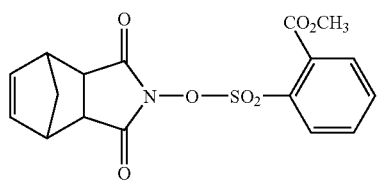

(PAG6-20)

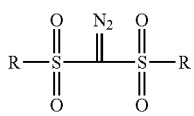

(4) Diazodisulfone derivatives represented by the following formula (PAG7):

(PAG7)

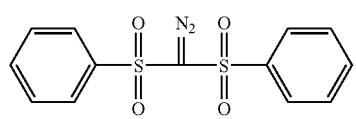

Herein, R represents a straight-chain, branched or cyclic alkyl group, or an unsubstituted or substituted aryl group.

The following compounds are examples of those derivatives, but these compounds should not be construed as limiting photo-acid generators usable in the invention.

(PAG7-1)

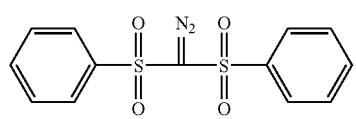

(PAG7-2)

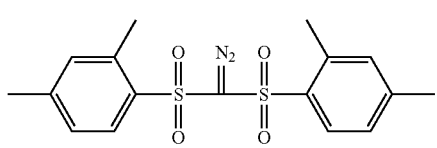

(PAG7-3)

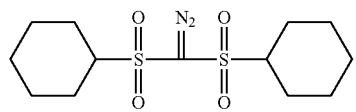

The addition amount of those compounds capable of decomposing and generating acids upon irradiation with an actinic ray or radiation is generally within the range of 0.001 to 40% by weight, preferably 0.01 to 20% weight, far preferably 0.1 to 10% by weight, more preferably 2 to 10% by weight, most preferably 6 to 10% by weight, based on the total solids in the composition.

The addition of the compounds in a proportion of 0.001% by weight or more is desirable in view of sensitivity. While the addition in a proportion of not higher than 40% by weight is also desirable in view of film shape and profile.

(C) Solvent

The present composition is dissolved in an organic solvent in which each of the foregoing components and optional components as mentioned hereinafter can dissolve, and coated on a support.

Suitable examples of a solvent used herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl, methoxypropionate, ethyl ethoxypropionate, methyl pyruvate, ethyl pyruvate, propyl pyruvate, —N,N-dimethylformaide, dimethyl sulfoxide, —N-methylpyrrolidone and tetrahydrofuran. These organic solvents can be used alone or as combinations of two or more thereof.

Of the solvents recited above, the preferred ones are 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether acetate, propylene glycol monoethyl ether acetate, methyl lactate, ethyl lactate, methyl methoxypropionate, ethyl ethoxypropionate, N-methylpyrrolidone and tetrahydrofuran.

(Other Components Usable in the Invention)

In the present positive resist composition for electron-beam, X-ray or EUV, alkali-soluble resins containing no acid-decomposable groups can be mixed in addition to the acid-decomposable polymer (a), and thereby the sensitivity can be increased.

The alkali-soluble resins having no acid-decomposable groups (simply referred to as "alkali-soluble resins", hereinafter) are resins soluble in alkali, and suitable examples thereof include polyhydroxystyrene, novolak resins and derivatives thereof. In addition, copolymer resins containing p-hydroxystyrene units can be used as far as they are soluble in alkali.

Of those resins, poly(p-hydroxystyrene), copolymer of p-hydroxystyrene and m-hydroxystyrene, copolymer of p-hydroxystyrene and o-hydroxystyrene, and copolymer of p-hydroxystyrene and styrene are preferred over the others. Further, poly(alkyl-substituted hydroxystyrene) resins, such as poly(4-hydroxy-3-methylstyrene) and poly(4-hydroxy-3,5-dimethylstyrene), and resins prepared by partially alkylating or acetylating the hydroxyl groups of the resins recited above can be used favorably as far as they are soluble in alkali.

Moreover, when part of the phenol nuclei of the foregoing resins each (at most 30 mole % based on the total phenol nuclei) is hydrogenated, the transparency of the resin is enhanced to produce desirable effects on sensitivity, resolution and formation of rectangular profile.

The suitable amount of alkali-soluble resins having no acid-decomposable groups added to the present composition is from 2 to 60% by weight, preferably from 5 to 30% by weight, based on the total solids in the composition.

The present positive resist composition responsive to electron beams, X-rays or EUV can further contain, if needed, acid-decomposable dissolution-inhibiting compounds, dyes, plasticizers, surfactants, photo-sensitizers, basic compounds, and compounds capable of promoting dissolution in developers.

In the present positive resist composition responsive to electron beams, X-rays or EUV, (d) a fluorine-based and/or silicon-based surfactant (including a fluorine-based surfactant, a silicon-based surfactant and a surfactant containing both fluorine and silicon atoms) can further be incorporated.

Examples of such a surfactant (d) include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable herein include fluorine-based surfactants and silicon-based surfactants, such as Eftop EF301 and EF303 (manufactured by Shin-Akita Kasei K. K.), Florad FC430 and FC431 (manufactured by Sumitomo 3M, Inc.), Megafac F171, F173, F176, F189 and R08 (manufactured by Dainippon Ink & Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries, Inc.). In addition, organosiloxane polymer KP-341 (manufactured by Shin-Etsu Chemical Co., Ltd.) can be used as a silicon-containing surfactant.

The amount of those surfactants mixed is generally from 0.01 to 2% by weight, preferably from 0.01 to 1% by weight, based on the total solids in the present composition.

Those surfactants can be used alone or as combinations of two or more thereof.

In the present positive resist composition responsive to electron beams, X-rays or EUV, (e) a basic compound, preferably an organic one, can be used. By using such a compound, the storage stability of the resist can be enhanced.

Organic basic compounds (e) usable to advantage in the invention are compounds having stronger basicity than phenol. Of such compounds, nitrogen-containing basic compounds are preferable to others.

Structures represented by the following formulae (A) to (E) can provide the nitrogen atoms in such compounds with favorable chemical environments.

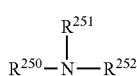
(A)

Herein, $R^{250}$, $R^{251}$ and $R^{252}$, which may be the same or different, each represents a hydrogen atom, an alkyl group having 1 to 10 carbon atoms, an aminoalkyl group having 1 to 6 carbon atoms, a hydroxyalkyl group having 1 to 6 carbon atoms, or a substituted or unsubstituted aryl group having 6 to 20 carbon atoms. Further, $R^{251}$ and $R^{252}$ may be combined with each other to form a ring.

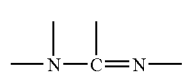
(B)

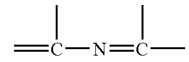
(C)

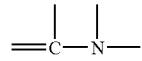
(D)

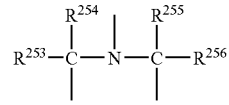
(E)

In the formula (E), $R^{253}$, $R^{254}$, $R^{255}$ and $R^{256}$ which may be the same or different, each represents an alkyl group having 1 to 6 carbon atoms.

The compounds preferable by far are nitrogen-containing cyclic compounds or nitrogen-containing basic compounds having at least two nitrogen atoms per molecule in different chemical environments.

As the nitrogen-containing cyclic compounds, those having polycyclic structures are more suitable. Good examples of a nitrogen-containing polycyclic compound include compounds represented by the following formula (F):

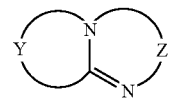
(F)

In the above formula, Y and Z each represents an unsubstituted or substituted straight-chain, branched or cyclic alkylene group, which may contain a hetero atom, independently.

Examples of such a hetero atom include a nitrogen atom, a sulfur atom and an oxygen atom. Suitable examples of such an alkylene group include 2–10C, preferably 2–5C, alkylene groups. Examples of substituents the foregoing alkylene groups can have include 1–6C alkyl groups, aryl groups, alkenyl groups, halogen atoms and halogen-substituted alkyl groups.

Examples of a compound represented by formula (F) include the compounds illustrated below.

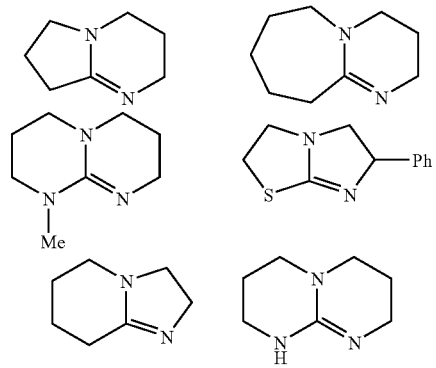

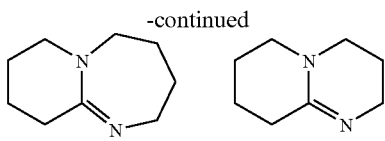

Of these compounds, 1,8-diazabicyclo[5.4.0]undeca-7-ene and 1,5-diazabicyclo[4.3.0]nona-5-ene are preferred over the others.

As the nitrogen-containing basic compounds having at least two nitrogen atoms per molecule in different chemical environments, compounds containing in each molecule both a substituted or unsubstituted amino group and a nitrogen-containing cyclic structure and compounds having alkylamino groups are especially preferred. Examples of such especially preferred compounds include guanidine, 1,1-methylguanidine, 1,1,3,3-tetraguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole. However, these examples should not be construed as limiting the scope of the basic compounds usable in the invention.

These basic compounds are used alone or as combinations of two or more thereof. The proportion of the basic compounds used to the total solids in the resist composition is generally from 0.001 to 10% by weight, preferably from 0.01 to 5% by weight.

The addition of basic compounds in a proportion lower than 0.001% by weight cannot produce the intended effect, while the addition in proportions higher than 10% by weight tends to lower the sensitivity and cause deterioration of developability in unexposed areas.

Compounds usable in the invention for promoting dissolution into a developer are low-molecular-weight compounds containing at least two phenolic OH groups or at least one carboxyl group per molecule and having molecular weight of 1,000 or below. When the compounds have carboxyl groups, it is preferable that they are alicyclic or aliphatic compounds for the same reasons as mentioned above.

The suitable proportion of these dissolution-promoting compounds is from 2 to 50% by weight, preferably from 5 to 30% by weight, based on the polymers used in the invention. Those compounds added in a proportion greater than 50% by weight give rise to aggravation of development residue and a new defect that patterns are deformed at the time of development.

It is easy for persons skilled in the art to synthesize the foregoing phenolic compounds having molecular weight of 1,000 or below by reference to the methods as described in JP-A-4-122938, JP-A-2-28531, U.S. Pat. No. 4,916,210 and European Patent 2,192,294.

Examples of such phenolic compounds include those recited below, but the compounds usable in the invention should not be construed as being limited to these examples.

Namely, examples of phenolic compounds usable in the invention include resorcinol, phloroglucine, 2,3,4-trihydroxybenzophenone, 2,3,4,4'-tetrahydroxybenzophenone, 2,3,4,3',4',5'-hexahydroxybenzophenone, acetone-pyrogallol condensation resin, phloroglucoside, 2,4,2',4'-biphenyltetraol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4-α-methylbenzylidene)bisphenol, α,α',α''''-tris(4-hydroxyphenyl)-1,3,5-triisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and para [α,α',α''-tetrakis(4-hydroxyphenyl)]xylene.

As dyes used in the invention, fat dyes and basic dyes are suitable. Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (all of which are products of Orient Chemical Industries, Ltd.), Crystal Violet (CI42555), Methyl Violet (CI42535), Rhodamine B (CI45170B), Malachite Green (CI42000) and Methylene Blue (CI52015).

For the purpose of enhancing the rate of acid generation by exposure to light, photo-sensitizers as recited below can be added. Examples of photo-sensitizers suitable for such a purpose include benzophenone, p, p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, but photo-sensitizers usable in the invention should not be construed as being limited to these compounds.

Those photo-sensitizers can act also as absorbents of far ultraviolet rays of a light source used. In this case, the light absorbents can reduce reflected light from a substrate and lessen the influence of multiple reflections within the resist film, thereby producing an effect of standing-wave improvement.

To the present compositions, surfactants other than the foregoing fluorine- and/or silicon-containing surfactants can also be added. Examples of such surfactants include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene-sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

The amount of these surfactants mixed is generally at most 2% by weight, preferably at most 1% by weight, based on the total solids in the present composition.

These surfactants may be added alone, or some of them can be added as combinations.

The electron-beam, X-ray or EUV positive resist composition relating to the invention is coated on a substrate for production of precision integrated circuit elements (e.g., silicon/silicon dioxide coating) in accordance with an appropriate coating method, e.g., a method of using a spinner or a coater. After coating, the resist-composition is pre-baked, exposed to light via the desired mask, post-baked, and then developed. Thus, resist patterns of good quality can be obtained.

As the exposure light source used herein, far ultraviolet rays having wavelengths of 250 nm or below are suitable. Examples of exposure light usable herein include KrF excimer laser (248 nm), ArF excimer laser (193 nm), $F_2$ excimer laser (157 nm), EUV (13 nm), X-rays and electron beams.

Examples of an alkali developer usable for the present electron-beam, X-ray or EUV positive resist composition include aqueous alkaline solutions containing inorganic alkalis (such as sodium hydroxide, potassium hydroxide, sodium carbonate, sodium silicate, sodium metasilicate and aqueous ammonia), primary amines (such as ethylamine and n-propylamine), secondary amines (such as diethylamine and di-n-butylamine), tertiary amines (such as triethylamine and methyldiethylamine), alcoholamines (such as dimethylethanolamine and triethanolamine), quaternary ammonium salts (such as tetramethylammonium hydroxide and tetraethylammonium hydroxide), or cyclic amines (such as pyrrole and piperidine).

The aqueous alkaline solutions to which alcohol and surfactants are further added in appropriate amounts can also be used.

EXAMPLES

The invention will now be illustrated in greater detail by reference to the following examples, but these examples should not be construed as limiting the scope of the invention.

Synthesis Example 1

Synthesis of Polymer B-1 as Acid-Decomposable Polymer (a))

Poly(p-hydroxystyrene) produced by Nippon Soda Co., Ltd. (Resin R-1) (molecular weight: 8,000, dispersion degree: 1.05) in an amount of 50 g was dissolved in 240 g of propylene glycol monomethyl ether acetate (PGMEA) This solution was heated at 60° C. and evacuated till the pressure in the reaction vessel was reduced to 20 mmHg. Thus, about 40 g of the solvent was distilled away together with the water remaining in the system.

The resulting solution was cooled to 20° C., and then admixed with 6.1 g of ethyl vinyl ether, 4.0 g of cyclohexylphenoxyethyl vinyl ether synthesized separately, and 0.02 g of paratoluenesulfonic acid, followed by stirring for one hour at room temperature. Thereafter, 0.02 g of triethylamine was further added for neutralization, and extraction operation using 240 g of ethyl acetate and 140 g of water was performed three times. The thus obtained polymer was referred to as B-1.

Synthesis Examples 2 to 15

Synthesis of Polymers B-2 to B-15 as Acid-Decomposable Polymers (a))

Acid-decomposable polymers were synthesized in the same manner as in Synthesis Example 1, except that the polymer having phenolic hydroxyl groups (trunk polymer) and the two kinds of alkyl vinyl ethers were replaced by those shown in Table 1, respectively, and referred to as Polymers B-2 to B-10, respectively.

In addition, a comparative resin (C-1) was synthesized in the same manner as described above, except that only one kind of alkyl vinyl ether shown in Table was used for acetalation.

TABLE 1

| Synthesis Example | Acid decomposable polymer | Trunk polymer (50 g) | Alkyl vinyl ether 1 (amount used) | Alkyl vinyl ether 2 (amount used) |
|---|---|---|---|---|
| 2 | B-2 | R-1 | ethyl vinyl ether (6.1 g) | cyclohexylphenoxyethyl vinyl ether (9.6 g) |
| 3 | B-3 | R-2 | ethyl vinyl ether (6.1 g) | t-butylcyclohexylcarbonyloxyethyl vinyl ether (12.1 g) |
| 4 | B-4 | R-3 | ethyl vinyl ether (6.1 g) | cyclohexylethyl vinyl ether (11.3 g) |
| 5 | B-5 | R-1 | isobutyl vinyl ether (6.1 g) | cyclohexylthioethyl vinyl ether (13.5 g) |
| 6 | B-6 | R-2 | ethyl vinyl ether (6.1 g) | n-butylcyclohexylcarbonyloxyethyl vinyl ether (9.7 g) |
| 7 | B-7 | R-3 | isobutyl vinyl ether (6.1 g) | phenoxyethyl vinyl ether (7.8 g) |
| 8 | B-8 | R-4 | ethyl vinyl ether (6.1 g) | 4-carbonylcyclohexylphenoxyethyl vinyl ether (8.8 g) |
| 9 | B-9 | R-4 | isobutyl vinyl ether (7.1 g) | benzyl vinyl ether (9.1 g) |
| 10 | B-10 | R-1 | ethyl vinyl ether (6.1 g) | cyclohexylphenoxyethyl vinyl ether (9.6 g) |
| 11 | B-11 | R-1 | methyl isopropenyl ether (6.3 g) | benzyl vinyl ether (12.0 g) |
| 12 | B-12 | R-2 | butyl isopropenyl ether (6.1 g) | cyclohexylmethyl vinyl ether (13.0 g) |
| 13 | B-13 | R-4 | butyl isopropenyl ether (6.3 g) | cyclohexyl isopropenyl ether (10.8 g) |
| 14 | B-14 | R-1 | butyl isopropenyl ether 5.2 g) | cyclohexylphenoxyethyl isopropenyl ether (13.0 g) |
| 15 | B-15 | R-1 | phenyl isopropenyl ether (4.3 g) | phenetyl vinyl ether (10.9 g) |
| Comparative resin | C-1 | R-4 | ethyl vinyl ether (8.5 g) | |

R-1: poly(p-hydroxystyrene), molecular weight: 8,000, dispersion degree: 1.05
R-2: p-hydroxystyrene/p-acetoxystyrene (85/15) copolymer resin, molecular weight: 9,000, dispersion degree: 1.4
R-3: p-hydroxystyrene/t-butylacrylate (85/15) copolymer resin molecular weight: 10,000, dispersion degree: 1.5
R-4: p-hydroxystyrene/styrene (95/5) copolymer resin, molecular weight: 10,000, dispersion degree: 1.5

R-1': poly(p-hydroxystyrene), molecular weight: 8,000, dispersion degree: 2.0

The acid-decomposable polymers B-1 to B-10 and C-1 were prepared into PGMEA solutions having the same solid concentration of 20% by weight and used in the following examples and comparative example, respectively.

Examples 1 to 20 and Comparative Example 1

Preparation and Evaluation of Positive Resist Compositions

Combinations of ingredients shown in Table 2 were each dissolved into 8.4 g of PGMEA, and passed through a 0.1-μm filter.

Thus, positive resist compositions were prepared. Therein, the PGMEA solutions of acid-decomposable polymers were each used in an amount of 7.66 g.

TABLE 2

| | Acid decomposable polymer | Photo-acid generator (amount used) | Surfactant | Basic compound (amount used) |
|---|---|---|---|---|
| Example 1 | B-1 | D-1 (0.08 g) D-3 (0.12 g) | F-1 | DBN (0.01 g) |
| Example 2 | B-2 | D-2 (0.22 g) | F-1 | DBN (0.01 g) |
| Example 3 | B-3 | D-3 (0.20 g) | F-2 | DBN (0.01 g) |
| Example 4 | B-4 | D-1 (0.18 g) | F-1 | DBN (0.01 g) |
| Example 5 | B-5 | D-2 (0.09 g) | F-2 | DMPA (0.02 g) |
| Example 6 | B-6 | D-1 (0.22 g) | F-1 | trioctylamine (0.01 g) |
| Example 7 | B-7 | D-2 (0.20 g) | F-2 | DMAP (0.02 g) |
| Example 8 | B-8 | D-1 (0.10 g) D-3 (0.10 g) | F-1 | DBN (0.01 g) |
| Example 9 | B-9 | D-2 (0.20 g) | F-1 | trioctylamine (0.01 g) |
| Example 10 | B-10 | D-1 (0.20 g) | F-1 | DMAP (0.02 g) |
| Example 11 | B-1 | D-1 (0.60 g) | F-1 | DBN (0.01 g) |
| Example 12 | B-2 | D-1 (0.56 g) | F-1 | DBN (0.01 g) |
| Example 13 | B-3 | D-2 (0.50 g) | F-1 | DMAP (0.01 g) |
| Example 14 | B-6 | D-1 (0.58 g) | F-2 | DBN (0.01 g) |
| Example 15 | B-7 | D-2 (0.50 g) | F-2 | DBN (0.01 g) |
| Example 16 | B-11 | D-1 (0.60 g) | F-1 | DBN (0.01 g) |
| Example 17 | B-12 | D-1 (0.56 g) | F-1 | DBN (0.01 g) |
| Example 18 | B-13 | D-2 (0.50 g) | F-1 | DMAP (0.01 g) |
| Example 19 | B-14 | D-1 (0.79 g) | F-2 | DBN (0.01 g) |
| Example 20 | B-15 | D-1 (0.68 g) | F-1 | DBN (0.01 g) |
| Comparative Example 1 | C-1 | D-1 (0.10 g) | F-1 | DBN (0.01 g) |

In each resist solution, the proportion of surfactant added was 100 ppm to the total ingredients.

The structural formulae of the photo-acid generators used are as follows:

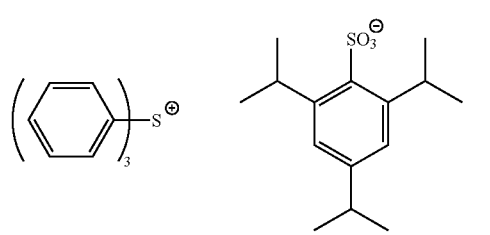

(D-1)

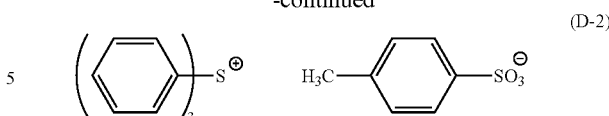

(D-2)

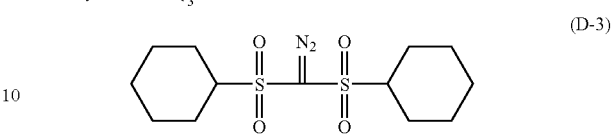

(D-3)

As to the surfactants used, F-1 stands for Megafac R08 (manufactured by Dainippon Ink & Chemicals, Inc.), and F-2 stands for Troysol S-366 (manufactured by Troy Chemical Industries, Inc.).

As to the basic compounds used, DBN stands for 1,5-diazabicyclo[4.3.0]nona-5-ene, and DMAP stands for 4-N,N-dimethylaminopyridine.

Each of those positive resist compositions was uniformly coated on a hexamethyldisilazane-treated silicon wafer by means of a spin coater, and dried by heating for 90 seconds on a 120° C. hot plate, thereby forming a 0.3 μm-thick resist film.

<Formation and Evaluation of Positive Resist Patterns>

Each of the resist films formed was irradiated with electron beams by use of an electron-beam drawing apparatus (HL750, made by Hitachi Ltd., acceleration voltage: 50 KeV). After the irradiation, each resist film was heated at 110° C. for 90 seconds. Then, it was immersed in a 2.38% by weight aqueous solution of tetramethylammonium hydroxide for 60 seconds, rinsed with purified water for 30 seconds, and then dried to form patterns.

Profile shapes of the patterns thus formed were observed with a scanning electron microscope (S-4300, made by Hitachi Ltd.). The limiting resolution (the smallest of all dimensions of line-and-space patterns separated and resolved) under the exposure permitting resolution of 0.15 μm lines (line: space=1:1) was defined as resolution.

Each of the wafers was set in a vacuum chamber, irradiated with electron beams in the irradiation amount providing the foregoing sensitivity, and baked (heat-treated) at 110° C. for 90 seconds just after the irradiation and after a 3-hour lapse from their radiation, and further subjected to development-processing as mentioned above, thereby forming line patterns.

And a 0.15 μm line pattern obtained through development-processing via the baking just after the electron-beam irradiation and a 0.15 μm line pattern through development-processing via the baking after the 3-hour lapse from the electron-beam irradiation were examined for line width and line edge roughness by means of a scanning electron microscope (S-9220, made by Hitachi Ltd.). (Specifically, each 0.15 μm line pattern was examined for line edge extended over a range of 5 μm in the length direction, and how distant the line edge was from the reference line on which the line edge was to lie was measured at each of 50 points within the foregoing range. Further, the standard deviation (σ) of the measured values was determined, and 3σ (nm) was taken as an indication of edge roughness).

Results obtained are shown in Table 3.

TABLE 3

| | Resolution (μm) | Line width change (nm) under in-vacuo PED | Line edge roughness under in-vacuo PED (just after irradiation → after 3-hour lapse from irradiation) (nm) |
|---|---|---|---|
| Example 1 | 0.09 | 1.6 | 6.1 → 6.2 |
| Example 2 | 0.10 | 1.7 | 6.4 → 6.5 |
| Example 3 | 0.10 | 1.6 | 6.3 → 6.4 |
| Example 4 | 0.11 | 1.7 | 6.4 → 6.5 |
| Example 5 | 0.10 | 1.6 | 6.7 → 6.9 |
| Example 6 | 0.11 | 1.7 | 6.5 → 6.6 |
| Example 7 | 0.11 | 1.6 | 6.3 → 6.4 |
| Example 8 | 0.10 | 1.7 | 6.4 → 6.6 |
| Example 9 | 0.11 | 1.7 | 6.6 → 6.8 |
| Example 10 | 0.10 | 1.6 | 7.8 → 8.1 |
| Example 11 | 0.10 | 1.7 | 5.8 → 5.9 |
| Example 12 | 0.10 | 1.7 | 5.8 → 6.0 |
| Example 13 | 0.11 | 1.8 | 5.9 → 6.0 |
| Example 14 | 0.10 | 1.7 | 5.9 → 6.0 |
| Example 15 | 0.10 | 1.7 | 6.0 → 6.2 |
| Example 16 | 0.10 | 1.8 | 6.4 → 6.6 |
| Example 17 | 0.11 | 1.7 | 6.2 → 6.3 |
| Example 18 | 0.11 | 1.7 | 6.5 → 6.7 |
| Example 19 | 0.10 | 1.8 | 6.6 → 6.8 |
| Example 20 | 0.10 | 1.8 | 6.6 → 6.8 |
| Comparative Example 1 | 0.13 | 3.0 | 10.1 → 10.8 |

As can be seen from the results shown in Table 3, the positive resist compositions according to the invention had excellent electron beam-responsive properties and offered high resolution, less extent of line edge roughness and reduced line-width change under in-vacuo PED, compared with the comparative one.

<Evaluation of Response to EUV Exposure>

Examples 21 to 22 and Comparative Example 2

Resist films were formed from the resist compositions prepared in Examples 1 to 2 and Comparative Example 1, respectively, in the same manner as in Example 1. Herein, however, the resist film thickness was adjusted to 0.25 μm. Each of the resist film obtained was subjected to mask exposure by means of EUV light (wavelength: 13 nm) as the exposure amount was increased by 0.5 mJ at a time in the 0–5.0 mJ range, and then baked at 110° C. for 90 seconds. Thereafter, sensitivity curves were determined by measuring dissolution speeds under each exposure by use of a 2.38% water solution of tetramethylammonium hydroxide (TMAH).

On each sensitivity curve, the exposure under which the resist dissolution speed reached the saturation point was defined as sensitivity, and dissolution contrast (γ value) was calculated from the slope of a linear portion of the sensitivity curve. The greater the γ value, the higher the dissolution contrast.

The results obtained are shown in Table 4.

TABLE 4

| | Sensitivity (mJ/cm$^2$) | γ value |
|---|---|---|
| Example 21 | 2.0 | 10.0 |
| Example 22 | 2.0 | 10.5 |
| Comparative Example 2 | 2.5 | 8.0 |

As can be seen from the results shown in Table 4, the positive resist compositions according to the invention had excellent EUV light-responsive properties and offered high sensitivity and high contrast, compared with the comparative composition.

By incorporating an acid-decomposable polymer (a) having repeating units represented by at least formulae (I), (II) and (III) in a positive resist composition relating to the invention, both requirements for in-vacuo PED characteristic and line edge roughness in the case of using electron beams are satisfied at the same time, and excellent sensitivity and dissolution contrast are achieved in the case of using EUV light.

What is claimed is:

1. A positive resist composition for electron-beam, X-ray or EUV, comprising:
   (a) a polymer capable of increasing its solubility in an alkali developer under action of an acid, wherein the polymer has repeating units represented by formula (I), repeating units represented by formula (II), repeating units represented by formula (III), and a molecular weight dispersion degree of 1.5 or below,
   (b) a compound capable of generating an acid upon irradiation with an actinic ray or radiation, and
   (c) a solvent:

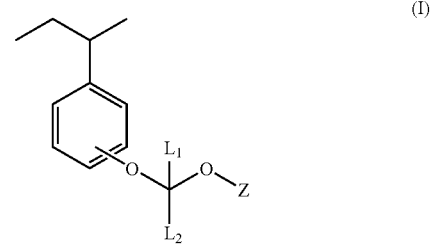

(I)

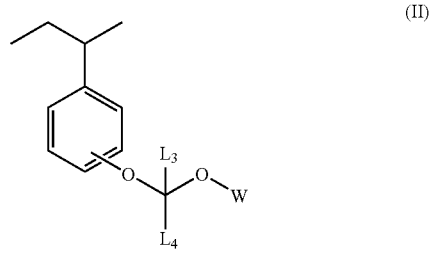

(II)

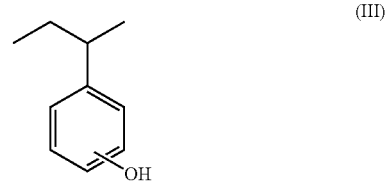

(III)

wherein $L_1$ to $L_4$, which are the same or different, each represents a hydrogen atom, a straight-chain, branched or cyclic alkyl group or an aralkyl group, and Z represents a straight-chain, branched or cyclic alkyl group or an aralkyl group, W has the same meaning as Z and is a group having an alicyclic or aromatic group, and Z and $L_1$, or W and $L_4$, may be combined with each other to form a 5- or 6-membered ring, provided that the groups represented by Z and W are not the same.

2. The composition according to claim 1, wherein the content of the repeating unit represented by formula (I) is from 5 to 60 mole % based on the total repeating units in the resin.

3. The composition according to claim 1, wherein the content of the repeating unit represented by formula (I) is from 5 to 30 mole % based on the total repeating units in the resin.

4. The composition according to claim 1, wherein the content of the repeating unit represented by formula (II) is from 5 to 60 mole % based on the total repeating units in the resin.

5. The composition according to claim 1, wherein the content of the repeating unit represented by formula (II) is from 5 to 30 mole % based on the total repeating units in the resin.

6. The composition according to claim 1, wherein the content ratio of repeating units of formula (I) to repeating units of formula (II) in the resin is from 0.10:1 to 1:0.10.

7. The composition according to claim 1, wherein the content ratio of repeating units of formula (I) to repeating units of formula (II) in the resin is from 0.25:1 to 1:0.25.

8. The composition according to claim 1, wherein the polymer (a) further comprises a repeating unit corresponding to tertiary alkyl(meth)acrylate.

9. The composition according to claim 1, wherein the content of the component (b) is from 2 to 10% by weight based on the total solids in the composition.

10. The composition according to claim 1, further comprising a fluorine-based and/or silicon-based surfactant.

11. The composition according to claim 1, further comprising a basic compound.

12. A pattern formation method comprising steps of forming a resist film by using the positive resist composition claimed in claim 1, and exposing and developing said resist film.

13. The composition according to claim 1, wherein Z is a straight-chain, branched or cyclic alkyl group or an aralkyl group substituted with a group having 12 or less carbon atoms.

* * * * *